US012313672B1

(12) United States Patent
Ludvik et al.

(10) Patent No.: US 12,313,672 B1
(45) Date of Patent: May 27, 2025

(54) SYSTEM AND METHOD OF TESTING FOR RF-INDUCED ELECTROMIGRATION IN SEMICONDUCTOR INTEGRATED CIRCUITS

(71) Applicant: Power Technology Solutions LLC, Palo Alto, CA (US)

(72) Inventors: Stephen Ludvik, Palo Alto, CA (US); John McKay, Santa Clara, CA (US)

(73) Assignee: Power Technology Solutions LLC, Palo Alto, CA (US)

( * ) Notice: Subject to any disclaimer, the term of this patent is extended or adjusted under 35 U.S.C. 154(b) by 0 days.

(21) Appl. No.: 18/975,398

(22) Filed: Dec. 10, 2024

Related U.S. Application Data

(60) Provisional application No. 63/666,610, filed on Jul. 1, 2024.

(51) Int. Cl.
*G01R 31/28* (2006.01)

(52) U.S. Cl.
CPC ..... *G01R 31/2858* (2013.01); *G01R 31/2875* (2013.01); *G01R 31/2879* (2013.01)

(58) Field of Classification Search
CPC ............ G01R 31/2874; G01R 31/2875; G01R 31/2877
See application file for complete search history.

(56) References Cited

U.S. PATENT DOCUMENTS

| | | | |
|---|---|---|---|
| 7,521,952 | B2 | 4/2009 | Chanda et al. |
| 7,602,201 | B2 | 7/2009 | Ysaguirre |
| 8,642,925 | B2 | 2/2014 | Keller |
| 10,180,359 | B2 | 1/2019 | Kendig et al. |
| 10,816,401 | B2 | 10/2020 | Kendig et al. |
| 2015/0049782 | A1* | 2/2015 | Karlquist ............... G01R 21/02 374/32 |
| 2018/0231587 | A1* | 8/2018 | Ye ..................... H01J 37/32174 |
| 2022/0132632 | A1* | 4/2022 | Godshalk ................ H05B 6/50 |

OTHER PUBLICATIONS

J.R. Black: Electromigration—A Brief Survey and Some Recent Results. IEEE Trans. Electron Devices, vol. ED-16 (No. 4), pp. 338-347, Apr. 1969.
I. Blech, Electromigration in thin film aluminum on titanium nitride J. Applied Physics 47, pp. 203-1208, 1976.

* cited by examiner

*Primary Examiner* — Tung X Nguyen
(74) *Attorney, Agent, or Firm* — Stephen E. Zweig

(57) ABSTRACT

A system and method of using a multi-zone substrate to perform electromigration testing of integrated circuits in the high-frequency RF domain. Here, the device under test (DUT) is affixed to a single, multi-zone substrate with a high-temperature zone, a transitional thermal isolation zone, to a low-temperature zone. The high-temperature zone has a DUT interface with a localized heater arrangement. The low-temperature zone provides the interface with RF lines to the RF test instrumentation. The DUT input and output pins are attached to the high-temperature zone, and the configuration allows both direct current (DC) and RF stressing of the DUT. The high-temperature zone can raise the DUT temperature to 300-450° C. The RF test port and associated test equipment remain at room temperature.

16 Claims, 28 Drawing Sheets

SYSTEM AND METHOD OF TESTING FOR RF-INDUCED ELECTROMIGRATION IN SEMICONDUCTOR INTEGRATED CIRCUITS

CROSS-REFERENCE TO RELATED APPLICATIONS

This application claims the priority benefit of U.S. provisional patent application 63/666,610, filed Jul. 1, 2024, the entire contents of which are incorporated herein by reference.

BACKGROUND OF THE INVENTION

Field of the Invention

This invention is in the field of integrated circuit testing, particularly testing of electromigration of metal traces within integrated circuits operating at high frequencies.

Description of the Related Art

The semiconductor industry has played a critical role in shaping society and impacted many industries, from the pervasive mobile device, automobile, healthcare, telecommunications, consumer, and national defense applications. However, the US semiconductor manufacturing capability has eroded over the past decades due to the heavy US reliance on offshore suppliers and reduced government R&D support. This situation has partly evolved from the behavior of US companies such as Apple, Nvidia, and Qualcomm to seek the "lowest cost" semiconductor components for their products. While this rationale makes business sense, its consequences have been far-reaching. Offshore companies meet these low-cost manufacturing expectations by typically taking advantage of R&D breakthroughs made by US research institutions and companies. Offshore companies are funded through major national investment in manufacturing rather than R&D, much different than the US funding model.

On-chip interconnect technology is vital to foundry nodes that support transistor nanometer dimensions ranging from 2 nm to 22 nm, and above. Integrated circuits from these foundry nodes operate in the GHz frequency range, and to date, there is practically no knowledge base on the role RF electromigration plays in the operation of these circuits and their long-term reliability impact. The unique test fixturing and test methods described in this invention serves as a vehicle for characterizing and developing new metallization to advance the performance and reliability of next-generation semiconductor devices.

Electromigration is a critical phenomenon associated with the physical movement of atoms inside a conductor due to current flow, occurring at current densities in the range of 10 million $A/cm^2$ and above. Although electromigration is a "slow" process compared to thermal or joule heating, its long-term effects on device failure have devastating consequences in mission-critical applications. These applications include defense, medical, satellite systems, and critical automobile systems such as self-driving vehicles and anti-lock braking equipment.

Early electromigration work included J.R. Black: Electromigration-A Brief Survey and Some Recent Results. IEEE Trans. Electron Devices, Vol. ED-16 (No. 4), pp. 338-347, April 1969. Black studied the simpler situation of electromigration in DC (direct current) conditions.

Other earlier electromigration work includes I. Blech, Electromigration in thin film aluminum on titanium nitride J. Applied Physics 47, pp 203-1208, 1976.

Thermoreflectance methods useful for such studies include the work of Kendig et al, U.S. Pat. Nos. 10,816,401, and 10,180,359, the entire contents of which are incorporated by reference.

For all integrated circuits, and particularly for advanced nanometer (nm) devices, high current densities associated with electromigration are reached at modest bias current levels in the microamp range. In DC-initiated electromigration, improvements have been made, such as the transition from aluminum to copper alloy metallization, among other innovations.

Other works on electromigration measurement include Chanda, U.S. Pat. No. 7,521,952B2; Keller, U.S. Pat. No. 8,642,925B2; and Ysaguirre, U.S. Pat. No. 7,602,201, the entire contents of which are incorporated herein by reference.

By contrast, the electromigration effects of RF current flow in the GHz range above 1 GHz are largely unknown. Nanometer integrated circuit designs (2 nm-22 nm) are emerging for wireless applications targeting the latest generation Wi-Fi, automotive radar, and phased arrays in the 1-100 GHz range. It is, therefore, critical to understand the electromigration behavior and implement improvements in the semiconductor manufacturing process.

Broadly speaking, the modern complex semiconductor wafer manufacturing process is divided into two areas: The Front end of Line (FEOL), where transistor arrays are formed, and the Back end of Line (BEOL), which is associated with multilayered interconnect metallization that connects the active transistors. The BEOL process is itself complex and involves many layers of interconnection of dielectric and metal traces that can entail as many as 10-14 layers With the nanoscale dimensions implemented in these circuits, the metallization process presents challenges to connect active transistor devices such as FinFETs, GAAFETs, and others, with high yield and high reliability.

The commercial markets immediately benefiting from these innovations include those requiring high reliability, such as medical equipment, automated driving vehicles, and long-duration satellite applications. Military applications also demand the best performance and reliability. Despite requiring lower wafer volume, these applications drive process improvements. Processes developed for military and NASA satellite systems are typically leveraged into dual-use markets and eventually benefit commercial applications.

BRIEF SUMMARY OF THE INVENTION

In some embodiments, the invention is a packaging method, test system, and test method for performing elevated-temperature testing of integrated circuits operating at high frequencies in the Gigahertz (GHz) range.

The invention is based, in part, on the insight that temperature-accelerated testing using multiple temperature zones is a key way to improve RF electromigration technology for integrated circuits, often called the "Device Under Test" or "DUT" in this disclosure. Here, test devices must be subjected to temperatures in the 300-450° C. range over a 5-200-hour timeframe to obtain observable behavior.

Unfortunately, conventional RF (radiofrequency) components required to connect to these test devices cannot support these extreme temperatures. By contrast, under DC (direct current) conditions, the interconnection and measurement processes are well-established and relatively straightforward.

The key challenge to successfully advancing RF electromigration processes is an RF test environment, test platforms, and test structures that can provide and survive temperatures in the 300-450° C. range. Although, under DC test conditions, large ovens and associated fixturing is well established in the semiconductor industry, these ovens are not compatible with RF components. Further, implementation of RF circuitry becomes prohibitively expensive making the approach unsuitable for a production environment.

The invention is also based, in part, on the insight that an alternative approach is required. Here, an alternative system and method is taught that teaches an improved test fixture that isolates the high temperature "oven" area to a small region surrounding the chip that is being tested. This improved test fixture thermally isolates the "hot region" from the high-temperature RF components of the text fixture.

The proposed method to eliminate the use of large ovens is to provide localized heating just in the area of the test device.

In some embodiments, the invention may be a system or method of using a multi-zone (which may be an array of single test modules, or a single substrate, but with multiple thermally isolated zones) to perform accelerated testing of high-frequency RF integrated circuits (DUT). Expressing the invention in methods format, this method may comprise:

Obtaining at least one multi-zone substrate. Here, this substrate will typically comprise a high-temperature zone and localized heater arrangement that is configured to accept at least one DUT (often an integrated circuit chip die, and/or an integrated circuit chip comprising multiple mounted dies). This substrate will also comprise a low-temperature zone (often at room temperature or at least below 85° C. configured with RF connection lines that connect this DUT to at least one RF test port located in this low-temperature zone.

According to the method, the DUT is attached to the high-temperature zone and at least some of the RF lines (e.g. electrical traces that connect the DUT to the substrate and RF lines) so that at least some of these RF lines connect to at least some of the DUT input and output pins, as well as to at least one ground pin.

Then, according to the method, a localized heater arrangement (often by applying electrical power to a localized heater) can be used to elevate the temperature of the high-temperature zone at the DUT, often around 300-450° C. At the same time that the DUT is subjected to this elevated temperature, the invention will simultaneously use the at least one RF test port and DUT test equipment to evaluate at least one DUT function over a range of RF frequencies and time intervals.

In some embodiments, the invention may be a novel system and method for measuring RF and DC electromigration properties of nanometer metal interconnects in advanced integrated circuits and other devices (such as quantum devices and mission-critical sensors).

In some embodiments, the invention may be a method for increasing the thermal resistance and controlling the temperature under a localized heater while providing heat separation using low thermal conductivity materials.

In some embodiments, the invention may be a method to implement multiple RF test channels and DC test channels within a single device.

In some embodiments, the invention may be a calibration technique for de-embedding parasitic circuit elements in device test fixtures.

In some embodiments, the invention may be for test structures that maximize thermal isolation between the test device and test instrumentation. The test device is often at 300-450° C., while the instrumentation is at room temperature or at least below 85° C.

In some embodiments, the invention may be for systems and methods that use two or more RF test signals that can separately stress and monitor test device parameters.

In some embodiments, the invention may be a system and method for accumulating large amounts of test statistical data by using multiple lines in parallel by means of structures optimized for RF measurement.

In some embodiments, the invention may be a test platform and method that may be used for a broad range of semiconductor technologies such as Silicon, Silicon Carbide and Gallium Nitride which have applications in RF communications and electric vehicle systems.

DETAILED DESCRIPTION OF THE INVENTION

Figure 1:
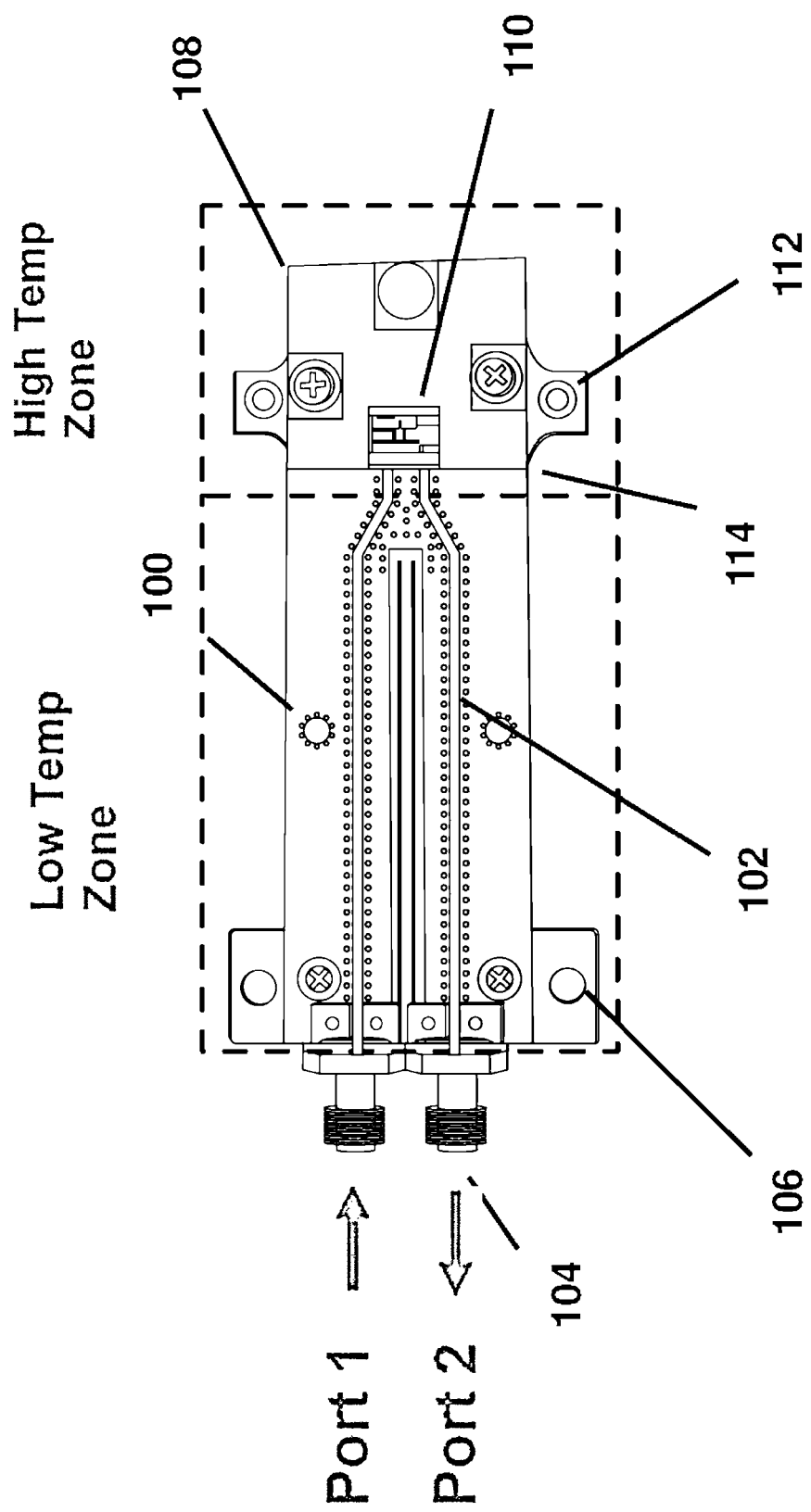
FIG. 1 shows the building block test module with high and low temperature zones connected by a thin polymer film 100 which is patterned with RF matched transmission lines 102.

State-of-the-art integrated circuits in modern foundry nodes can contain as many as 100+ billion transistors in a single device. While the detailed performance of individual transistors is a major challenge, a deep understanding of the nanometer metallization that interconnects these transistors is crucial to the long-term successful deployment and reliability of these complex circuits. Electromigration is a well-known phenomenon that limits metallization interconnect reliability. During the electromigration process, the electron current flow physically moves atoms, and the presence of metal defects or dislocations creates voids and hillocks that result in electrical shorts and opens within the circuit. These electromigration effects also depend on fundamental metallization chemistry, process methods, and process uniformity. There is a significant body of knowledge for DC current electromigration behavior, but not so for nanometer trace dimensions. At GHz and millimeter wave operating frequencies, there is currently no knowledge base for integrated circuits operating at these high frequencies. With circuit dimensions rapidly approaching below 2 nanometers, measurement Methods and characterization of these processing parameters related to electromigration and associated design rules is essential to realize these new technologies.

Test platforms and test methods must provide actionable data to guide process and structure innovations to mitigate electromigration effects. This is especially true for RF driven electromigration, but even DC effects suffer from the same roadblocks. Guidance from Black's early electromigration work on integrated circuits proposed a relationship for DC currents shown in equation 1 below:

$$MTTF = \frac{A_o}{J^n} e^{\frac{E_a}{kT}}$$

Where: MTTF=Median time to Failure
j=Current Density
$E_a$=Activation energy based on metallization (eV)
T=Temperature in deg K
k=Boltzmann's constant
$A_o$, n are structure and material dependent This empirical Black model for DC-induced electromigration has proven useful, and copper-based alloys have generally been shown to provide longer MTTF (Mean Time To Failure) than aluminum alloys. This model shows an exponential dependence of MTTF on temperature at a given activation energy and an inverse dependence on current density. This heuristic model provides a good guide for macro and nano-size conductors under DC conditions. The physical DC model is that the electron flow from the cathode to the anode moves ions toward the anode, and defects create voids and "whisker growth," leading to long-term failure of traces. Subsequent work by Blech on thin film structures found that electromigration did not occur at certain trace lengths in the 10-100-micron range. Blech inferred there was a "pile-up" of atoms near the anode, which reduced the electromigration effect.

Since electromigration does occur under RF conditions (Ysaguirre), (Chen), the previously published work below 1 GHz provides some insights using conventional integrated circuit metallization. Intuitively, RF electromigration should behave differently since electron flow is in both directions. Mechanisms such as metal fatigue and stress effects have been suggested. But in any event, there is very little knowledge on the impact of RF electromigration, which can have a profound effect on next-generation nm semiconductor devices.

It is likely that the Black model will help guide the activation energy and current density dependence of RF electromigration behavior, albeit with different physical mechanisms.

Figure 3:
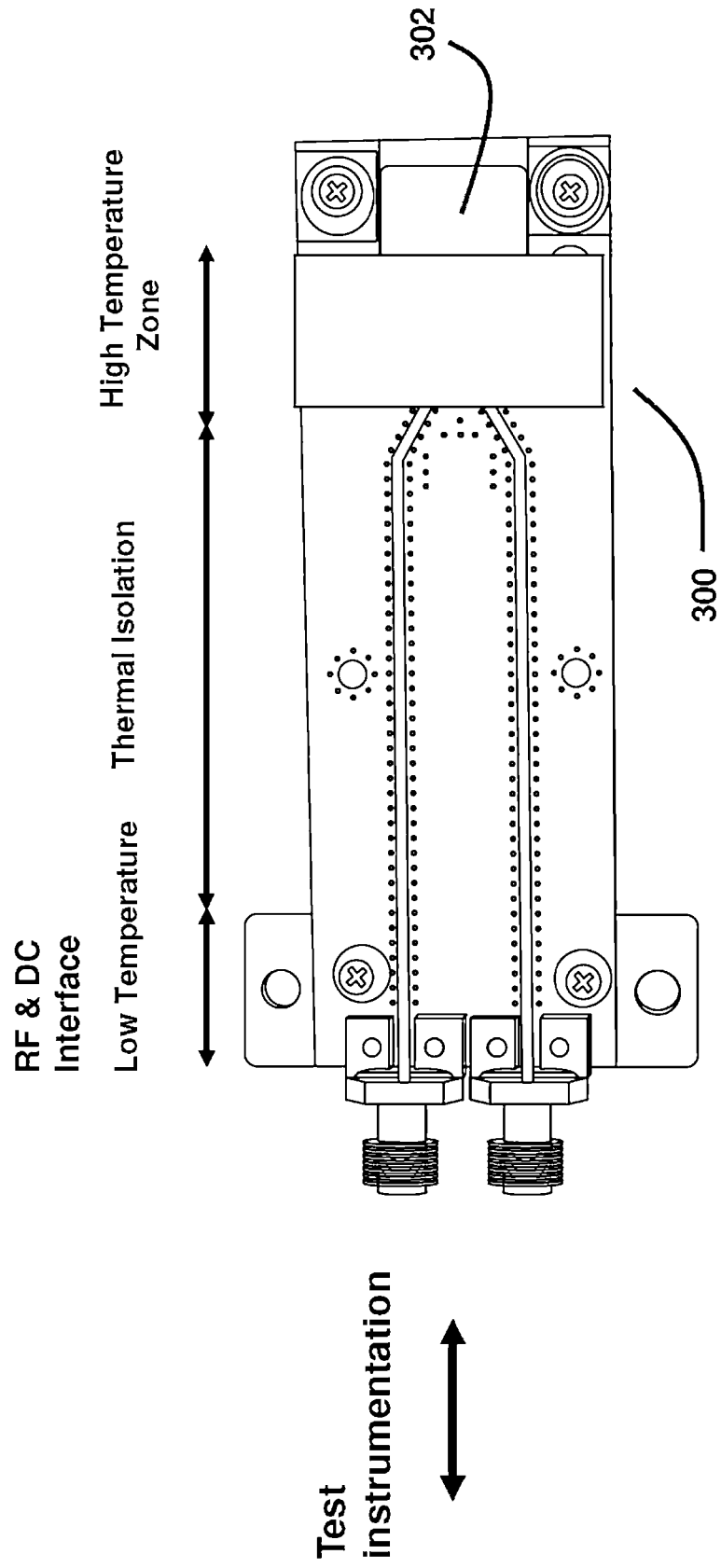
FIG. 3 shows another embodiment that adds a ceramic lid 302 to cover the test device. The lid provides an environmental seal while maintaining DC and RF connections. In addition to environmental protection, the lid provides electrical shielding to emulate the RF conditions that the test device will experience.

To obtain failure data in a reasonable timeframe of around 5-200 hours (or less), operating temperatures in the 300-450 deg C. range are required. While these temperatures are relatively straightforward for DC operating conditions, they require innovation to support high temperature RF test platforms. The RF materials and structures used in the RF test modules must be researched, designed, and developed to withstand the same temperature range. FIG. 3.5.2 shows an example of a method to achieve these goals. The flexibility provided by RF measurement and stressing can also reduce the test time to initiate electromigration behavior, which can improve production throughput and yields.

The current density is another important parameter and strongly influences the MTTF, following an inverse dependence on current density. Factors such as dimensional control, geometry, interlayer effects, defects, and composition all play a role in determining electromigration behavior. Analysis of these factors will require a close working relationship with the foundry to obtain meaningful statistical data. Furthermore, cost-effectively scaling to larger sample sizes is also key as the tests are required to establish a baseline for RF electromigration, and sample testing is routinely performed on each wafer lot as part of the production process.

Test vehicles and test methods on electromigration support the broad semiconductor market encompassing advanced integrated circuits and diverse applications such as 5G/6G wireless, satellite, automotive radar, quantum devices, and AI systems. Newer semiconductor technologies, such as Gallium Nitride (GaN) and Silicon Carbon (SiC), play an important role in electric vehicle and energy storage systems. are also subject to performance limitations due to electromigration.

Testing for electromigration requires temperature environments in the 300-450° C. range to emulate actual operating conditions over an extended period. At these temperatures, testing is restricted to passive metallization structures. Active components and ancillary test components cannot operate under these extreme conditions. Existing test methods are restricted to DC biasing, where high-temperature components are available. Testing for combined DC and RF stress requires a different approach.

While temperature stressing is one method for emulating trace failure due to electromigration, another approach is to use multiple traces in parallel, which increases the statistical significance for observing failures, This approach more closely resembles the operation of a high-density circuit.

A novel RF packaging method is described which provides unique advantages over large, temperature-controlled ovens that are limited to DC measurements, or wafer level testing that requires complex chuck heaters that are both costly and limited in temperature range. The RF method also provides a better vehicle for testing multi-trace structures, giving visibility into interconnect behavior under more realistic conditions To activate the electromigration process, the test device must be operated at temperatures in the 300-450° C. range. Under DC conditions, large ovens and associated fixturing support these stress conditions and are well-established in the semiconductor industry. However, these ovens are not compatible with RF components and RF circuitry, which are limited to less than 85° C. operation.

As previously discussed, a critical factor is optimizing the RF electromigration test structure. For measurement. Advanced RF instrumentation at GHz frequencies and their associated RF interconnect components are based on standard 50-ohm transmission systems, providing the best measurement repeatability and accuracy. A common system impedance provides uniform calibration and minimizes internal system reflections contributing to inaccuracy. An example of an electromigration test structure for simultaneous RF and DC stressing is shown in FIG. 1.

The configuration allows for simultaneous RF and DC stressing The DC current flow is set independent of the RF level. Under DC conditions, the electron flow causes motion of metallization toward the anode in the opposite direction to the current flow. Longer-term, the metal trace develops voids and hillocks, resulting in device failure. Behavior under RF conditions defect formation is poorly understood, and there is limited knowledge of failure mechanisms. For nanometer metal trace dimensions, the trace current density can exceed 2 Million amp per square centimeter. at microamp current levels The DC current flow is set independent of the RF level and behaves like standard DC electromigration configurations such as those recommended in JEDEC standards. Under DC conditions, the electron flow causes motion of metallization toward the anode in the opposite direction to the current flow and long-term trace and subsequent device failure. During RF stress, RF power flows from Port 1 to Port 2 and can be measured in either a transmission or reflection mode. While the RF current is "AC," electromigration also occurs (Yasguirre), (Chen), but the mechanisms are different from the DC stress.

FIG. 1 shows the building block test module with high and low temperature zones connected by a thin polymer film 100 which is patterned with RF matched transmission lines 102. The low temperature section provides the electrical interface 104 and is secured to the test housing 106 to maintain mechanical integrity, and room temperature conditions for the test interface. The device under test (DUT) 110 is mounted in the high temperature zone on a thin metal carrier 108 that is attached to the heating element directly below the carrier using mounting screws at 112. The DUT, in die form, is attached to the carrier using high temperature epoxy and wire bonds connecting it to the two transmission lines. The RF and DC test excitations from the test instrumentation are applied through the coaxial connectors at the input ports 104. The DUT carrier extends a short distance beyond the reference line 114. The extension of the carrier beyond the reference lime is just enough to allow a secure wire bond. The thermal-isolation zone between the two zones (high and low-temperature zones) is critical to achieve thermal isolation and provide integrity during the test period. The use of the thin flexible membrane provides additional thermal isolation.

Note that in some embodiments. The DUT may be an analog circuit. In other embodiments, the DUT may be a digital circuit (digital DUT). In still other embodiments, the DUT may have mixed analog and digital sections.

Figure 2:
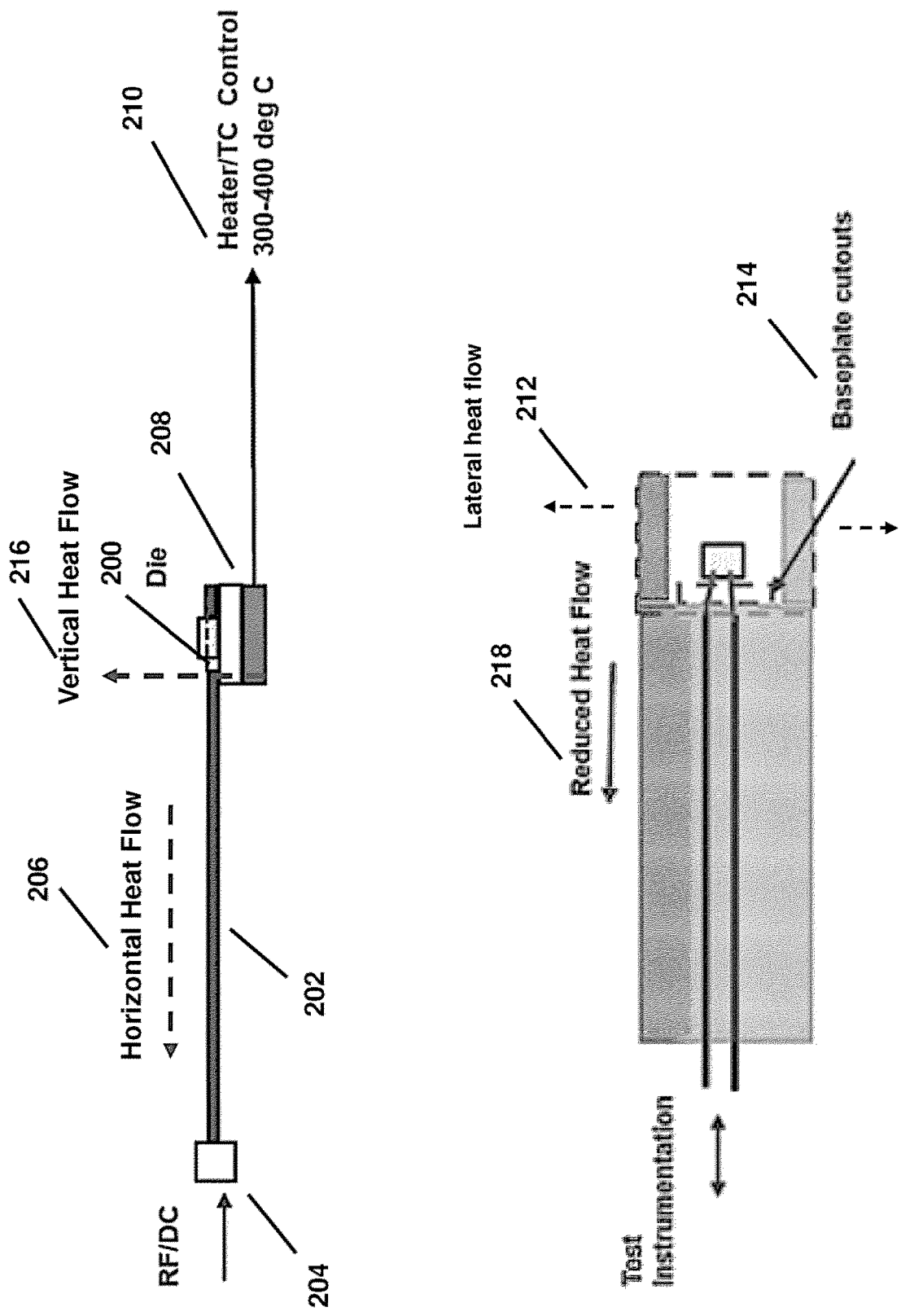
FIG. 2 shows a schematic of the test interface to the test device and the associated thermal paths for performing electromigration tests.

FIG. 2 shows a schematic of the test interface to the test device and the associated thermal paths for performing electromigration tests. The RF and DC stress excitations are applied through connectors 204 which are held at room temperature. A thin flexible film 202 which is patterned with the RF test transmission lines provide a high thermal resistance to horizontal heat flow 206. The miniature heating element 210 is located directly beneath the die carrier 208 and is in direct thermal contact with it. The low thermal mass assembly can effectively heat the test die while minimizing the vertical heat flow 216 to the flexible interconnection to the test system. There is a precisely controlled overlap between the test circuit and the die carrier. The only other heat path to the test circuit are the bond wires connecting the test die 200 to the system. Other embodiments to reduce horizontal heat flow 218 are realized by adding cutouts 214 to the die carrier. These alternate die carrier shapes can be achieved through metal punching and provide a low-cost mounting scheme. Lateral heat flow 212 also increases the thermal mass of the test structure and the thermal isolation can be increased through the use of low thermal conductivity ceramic mounting schemes.

FIG. 3 Another embodiment 300 adds a ceramic lid 302 to cover the test device. The lid provides an environmental seal while maintaining DC and RF connections. In addition to environmental protection, the lid provides electrical shielding to emulate the RF conditions that the test device will experience.

Figure 4:
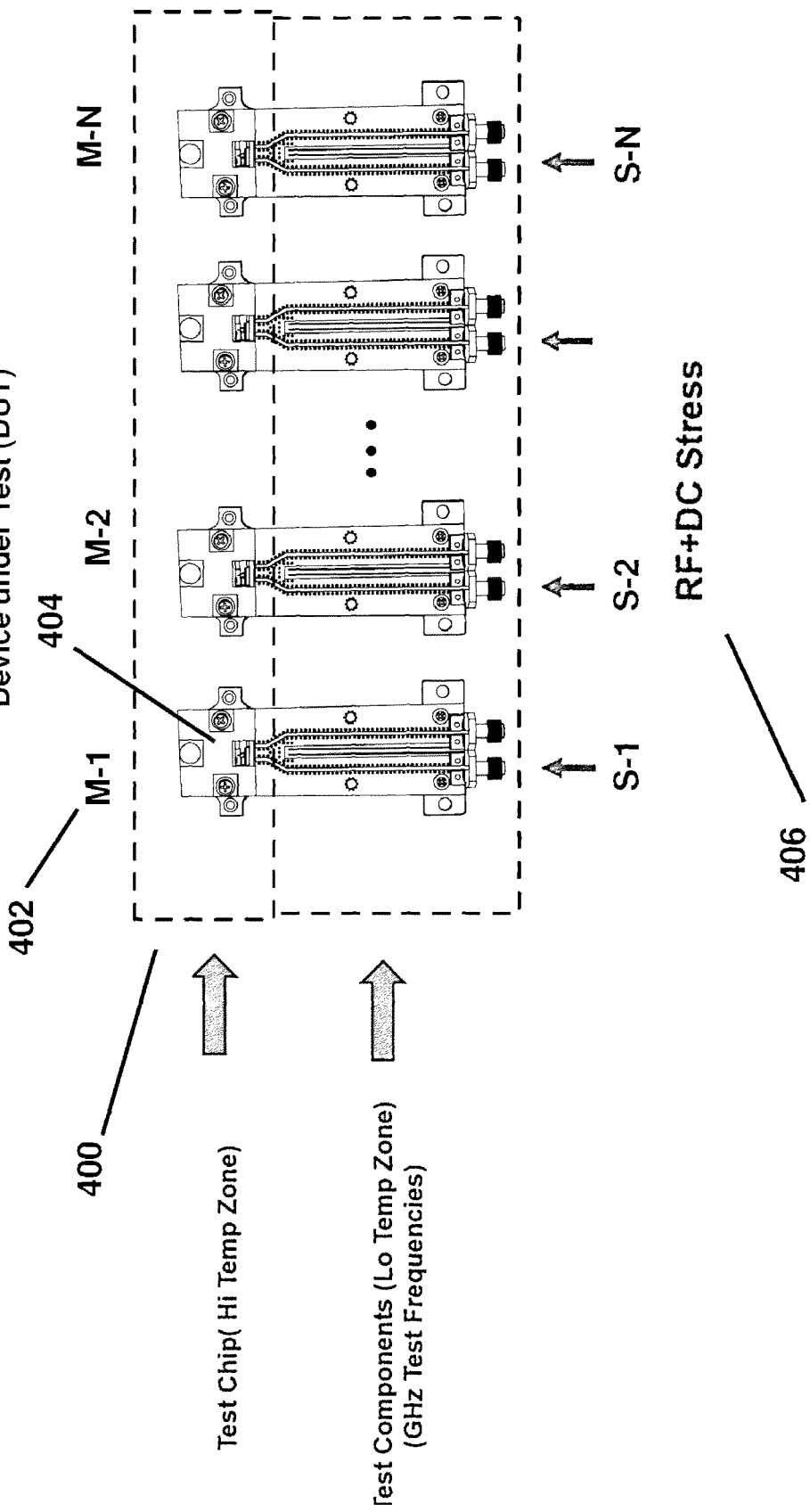
FIG. 4 shows scaling test modules that allow for multichip testing and increases the available statistical information on the nm metallization structures, including uniformity over the wafer, metallization process development and activation energy of the electromigration process.

FIG. 4 Scaling test modules as shown in region 400 allows multichip testing and increases the available statistical information on the nm metallization structures, including uniformity over the wafer, metallization process development and activation energy of the electromigration process. The channels 402 are independently controlled 406. Temperature, RF and DC test conditions on each test device 404 can be identical, if statistical data is needed. For metallization process development, design-of-experiments are critical tools and the ability to independently set the test conditions reduces the test and resulting process development times.

Figure 5:
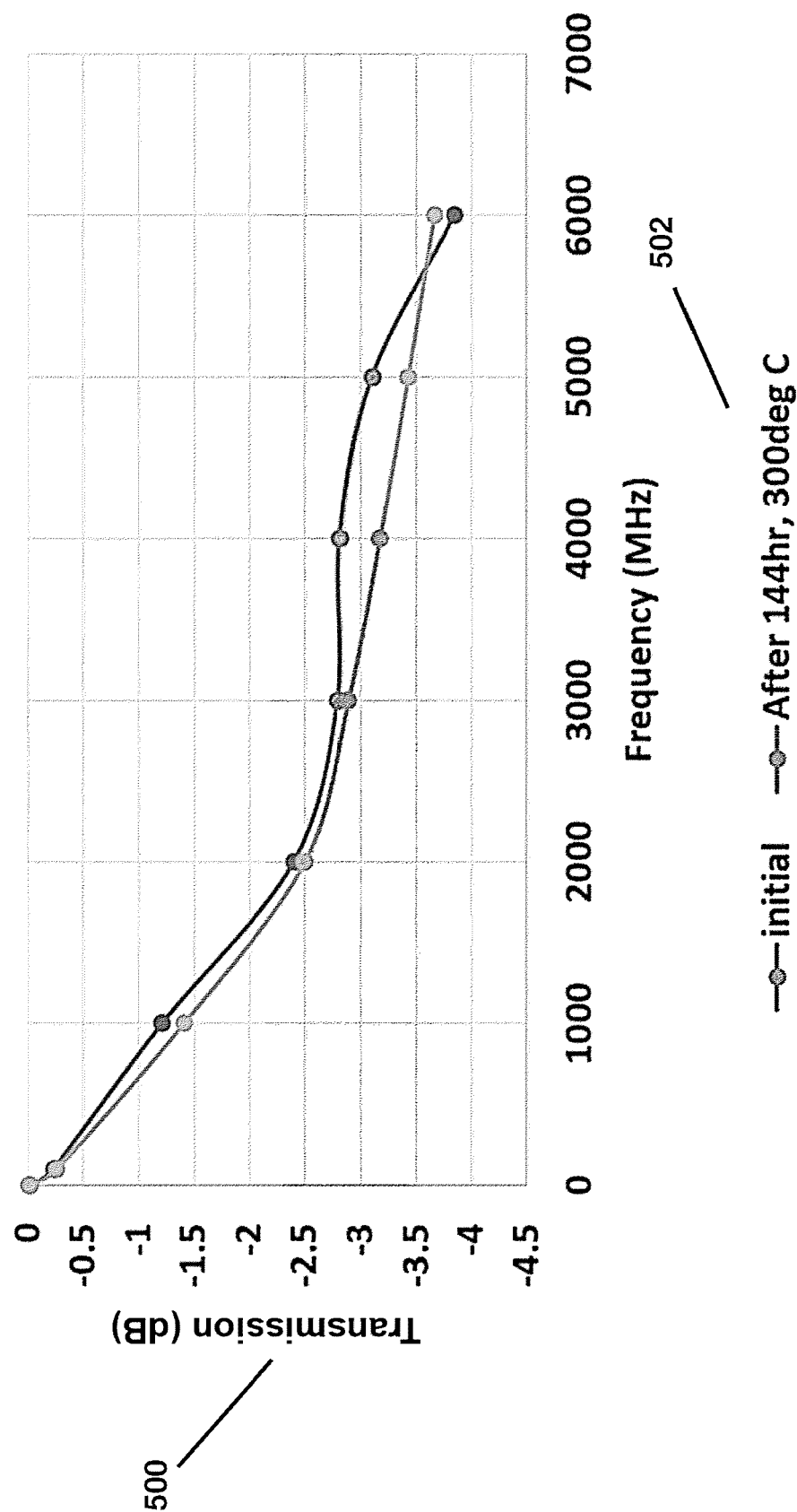
FIG. 5 shows that the test module integrity can be validated by stressing a calibrated through line that connects the RF signal between its two test terminals.

FIG. 5 The test module integrity is validated by stressing a calibrated through line that connects the RF signal between its two test terminals. The Fig. shows an example of the transmission loss before and after temperature stressing 502. Optimizing the test module and a calibration procedure minimizes the effect of variations due to the test structure itself.

Figure 6:
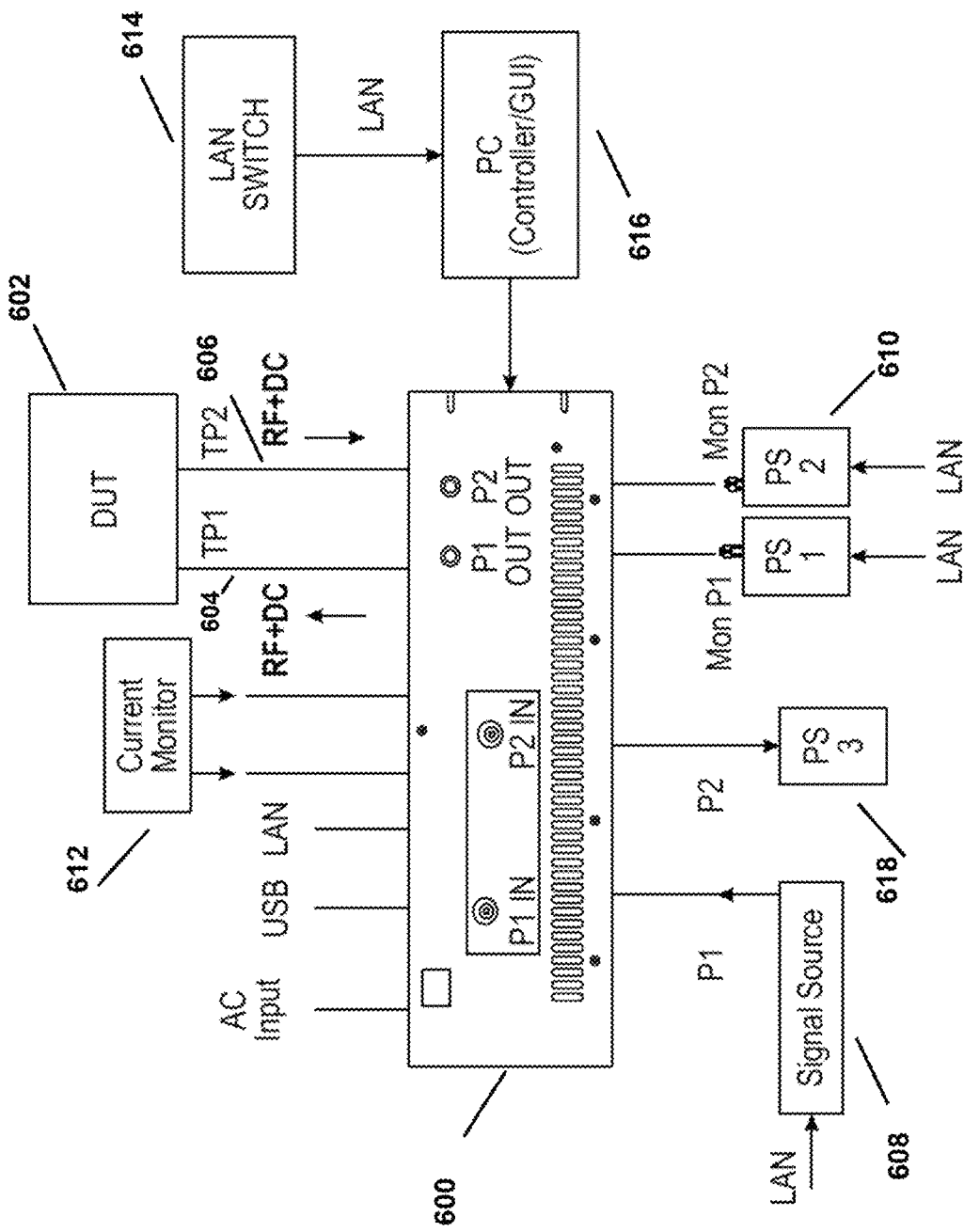
FIG. 6 provides an overall block diagram of a single channel the test system.

FIG. 6 provides an overall block diagram of a single channel the test system. The architecture is scalable as described in FIG. 4 to multiple channels where test parameters can be independently set. The hardware control module 600 provides the central control and monitoring functions. The system can be operated in two modes: transmission and reflection. The functionality of these more fully defined in FIGS. 9 and 10. Two outputs at the rear of the control module are connected by coaxial cables to the device under test (DUT) 602 at the reference ports TP1 604 and TP2 606, which are electrically calibrated. These ports proved the RF and DC stress excitation to the DUT which is mounted in the scheme shown in FIG. 1. The system monitors the DUT electrical and thermal parameters which are automatically logged by the PC controller 616. The main controller sets the DC test conditions and overall system polling times while an external current meter can be connected at 612 to verify the DC bias current.

The RF stress is generated by a signal source 608, which varies both the power level, frequencies and waveforms that are applied to the DUT 602. Monitoring of the input test signal and the associated transmitted or reflected signals is achieved using several power sensors as shown at 610. The input RF signal is monitored at 618 from an RF coupler within the control module. Where more detailed signal analysis is required, such as application of multiple input frequencies or complex waveforms, RF instrumentation can be used in place of the power sensors. Overall system integration and communication is provided by a common LAN interface 614. A more detailed description of the internal functionality of the test instrumentation is provided in FIG. 7.

Figure 7:
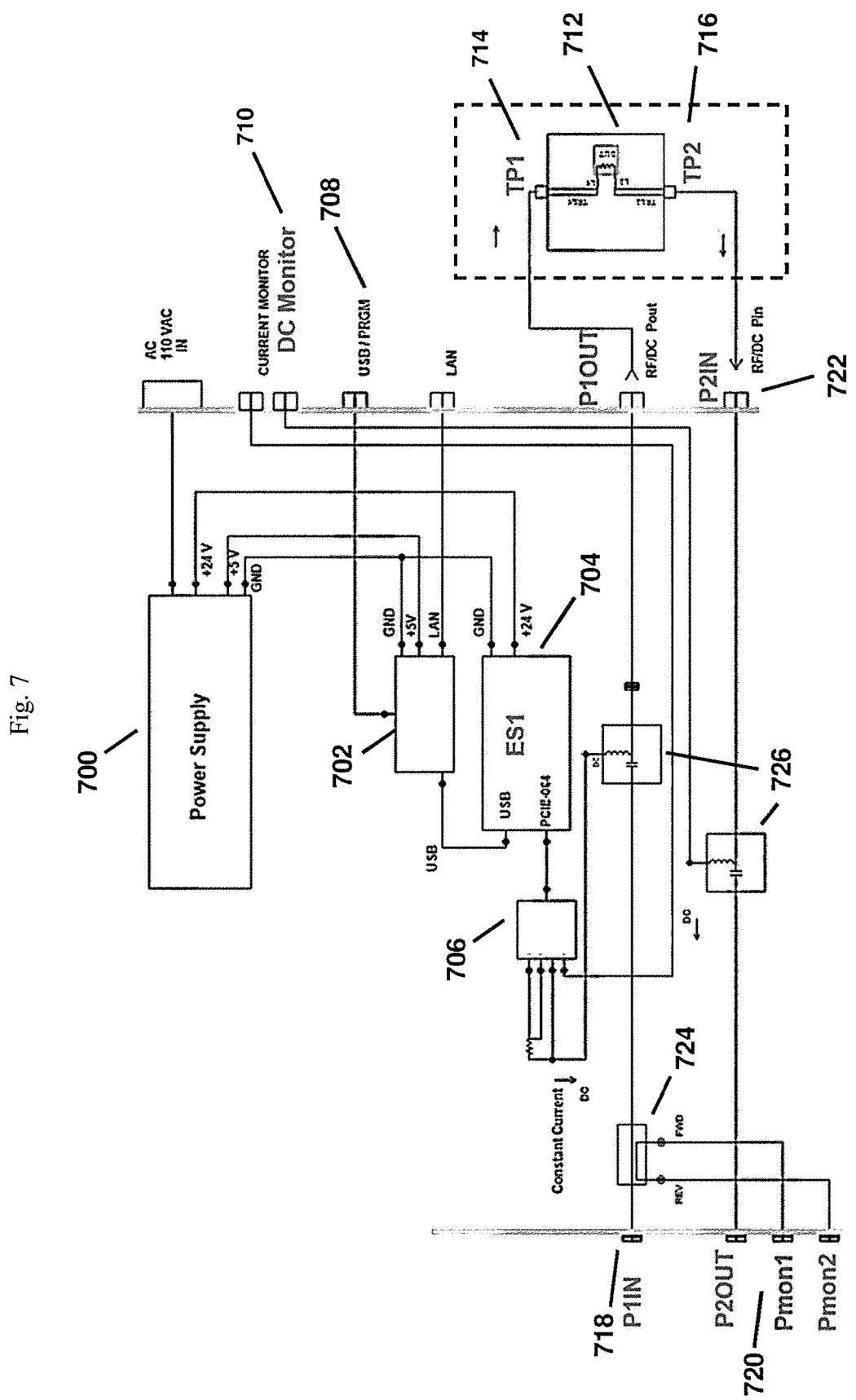
FIG. 7 shows the internal configuration of a single channel system that can be scaled for multiple device testing.

FIG. 7 shows the internal configuration of a single channel system that can be scaled for multiple device testing. The main power supply 700 generates the internal voltage bus driving the local controller 702 and the electrical interface board 704 that provides multiple functions such as analog/digital conversion (ADC/DAC) and USB control. An additional interface board 706 generates a constant current source that is used in measuring the DC resistance of the DUT during the stress cycle. The test platform outputs are connected to the DUT, 712 from the rear panel of the control module 722 to the reference ports TP1,714 and TP2,716 using cables whose losses are extracted in the calibration process. The test cables allow the system to be configured for on-wafer measurements as described in FIG. 8.

The RF test path from the signal source 718 to a broadband bidirectional coupler, 724 that supports broadband test signals, covering kHz to GHz frequencies. The coupler senses the forward input power and the reflected power from the DUT which are measured at the front panel locations 718 and 720, respectively. Internal bias tees 726 are in series with the test path that inject and return the DC current flow. The broadband bias tees enable simultaneous DC and RF stressing while separating the measurement functions.

In some embodiments, at least one computer processor and associated graphical user interface (GUI) may be used to control the equipment connection, and to control other test parameters such as the set DC Current interface, the set RF Power and Frequency interface. This graphical user interface may also comprise various control buttons and equivalent, such as buttons to control the PM calibration, Initialize the process, Identify the board under test, initiate datalogging, and monitor the DC and RF Power. This GUI was previously discussed in provisional application 63/666,610, the contents of which are incorporated herein by reference.

Regarding PM Calibration: For long term testing, power sensors are used to monitor the DUT RF characteristics. The values can be changed in the window and correspond to the module under test.

Regarding the equipment Connection: When using the signal generator mode and the remaining IP addresses will match the value and socket indicated on the switch. Once these are confirmed connection to each instrument can be made by clicking the corresponding button.

Regarding the Initialize section: This selection populated the dashboard with default (or its previous) settings In a Global Voltage Set window, the user may enter the value for VDD (2V).

For initial setup any value between 0.2V and 6V can be entered. Once the module is enabled the external current monitor will provide the DC current level (250 microamp, min to 6 mA, max). Lower current values require an external resistor connected in series with the current monitor.

Regarding set RF power and Frequency. The system gain is determined during the calibration process and measures the gain (loss) from the signal generator output to the DUT input test port TP1. The GUI allows setting the desired test power (0 dBm) is entered and the "SET VALUE" is selected in order to set the signal generator at the necessary value. The value can be confirmed using an external power sensor at port TP1. The frequency value (MHz) is entered into the windows and the "SET FREQUENCY" is selected. For the P1001E, the input and output frequencies are the same. The RF power can be manually turned ON/OFF using the "SG ON" and "SG OFF" buttons.

Regarding the Board interface. After initialization, the GUI allows setting the Module ID (or Channel) is populated and the user enters the Board ID. To enable monitoring the channel, the checkbox for that board is selected. The system stores information in computer memory in a selected directory. After initialization additional functions are selected including, "RAMPUP", "RAMPDOWN" and "START" buttons. When these steps are completed, DC bias is applied to the DUT. The DC bias can be turned off by selecting "STOP".

Regarding the interface to initiate Datalogging: The GUI is used to initiate Datalogging by either selecting the Data Monitor cycle "Start Monitor" or Power Monitor Cycle "Start Monitor" separately or both depending on the test stage. The cycle time can be entered (5 sec, example). The measured values are recorded in the window and also stored in a user selected directory in computer memory.

Regarding DC & RF Power Monitoring: In a similar fashion the GUI starts the DC (Data) and RF (Power) monitoring files can be stored in a .csv format and each reading is time-stamped. In this embodiment, each time the monitoring is stopped and restarted, a new file is created.

Figure 8:
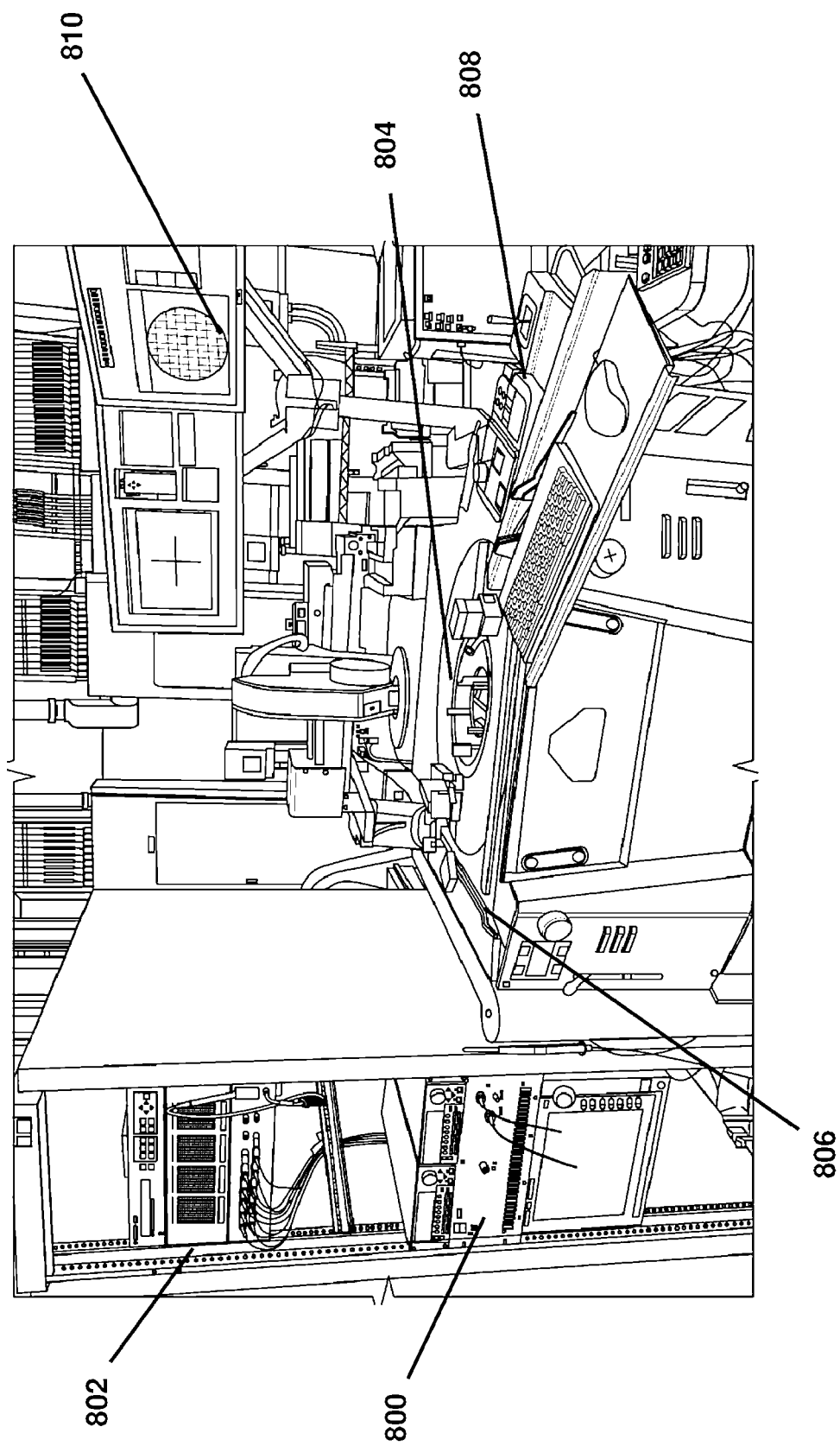
FIG. 8 shows the test system configured for wafer level testing.

FIG. 8 shows the test system configured for wafer level testing. The test module 800, signal generator 802 and related RF test equipment is mounted in an adjacent rack. Test cables connect the system to wafer probes 800-802 that facilitate on-wafer measurements on a test device 804 prior to dicing the wafer for stressing. The user interface 806, controls the probe positions. User positioning control 808 and monitoring 810 are performed externally.

On-wafer measurements are not suited for long term, high temperature stressing. The behavior of the probe contact with the wafer metallization is not stable and can create intermetallic diffusion. Also, the wafer system has a much higher thermal mass and is not scalable is not practical due to the equipment expense. Nonetheless, wafer level measurements can provide valuable tracking information and DUT pre-screening data at the wafer level to correlate with final test data.

Figure 9:
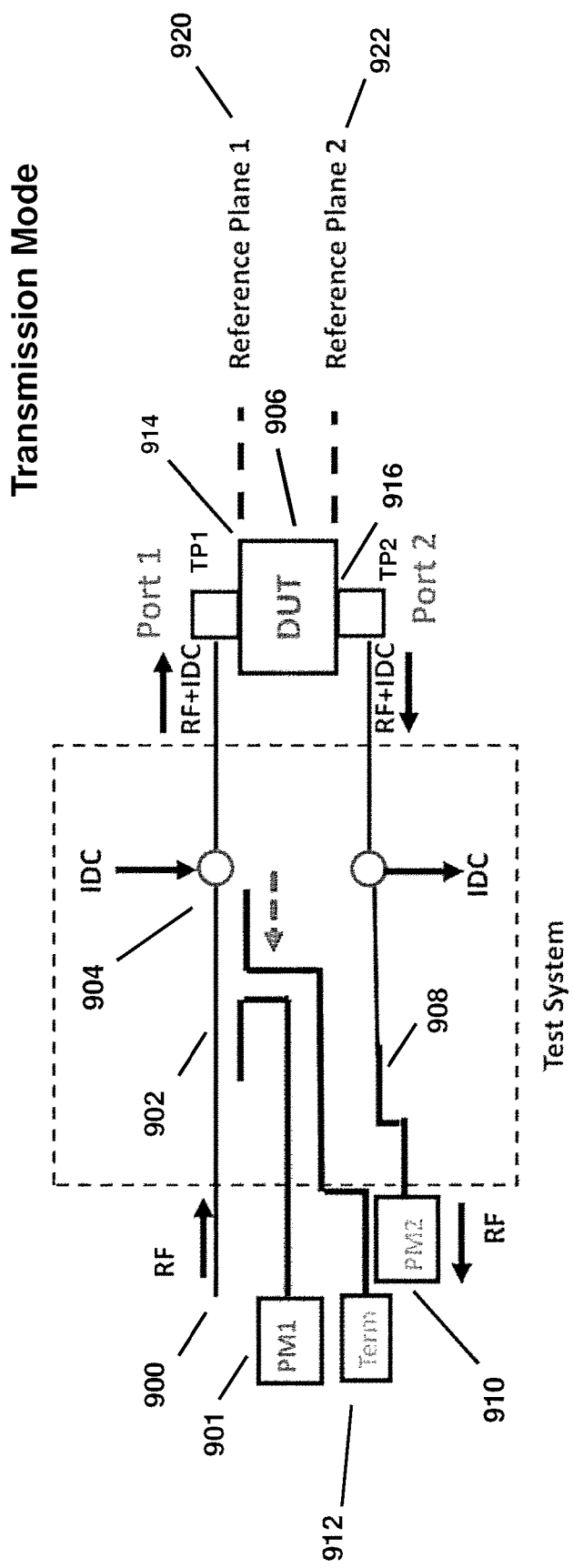
FIG. 9 shows the test signal flow in the transmission mode.

FIG. 9 shows the test signal flow in the transmission mode. The forward power at the RF test signal input 900 is sampled by an internal coupler 902 and measured at its associated power sensor 901. The signal then is combined with the DC stress through a bias tee at 904 to feed the device under test (DUT) 906. The resulting signals pass through the DUT and the transmitted though the 908 path to the output power sensor 910. The calibration process establishes reference planes 920 and 922 at the DUT interfaces TP1 914 and TP2 816. Using the calibration corrections at the test ports provides the ratio of output to input power levels referred to as S21. The measurements at the reference planes are de-embedded within the test module, referring to FIG. 1, to determine the characteristics of the individual die.

Figure 10:
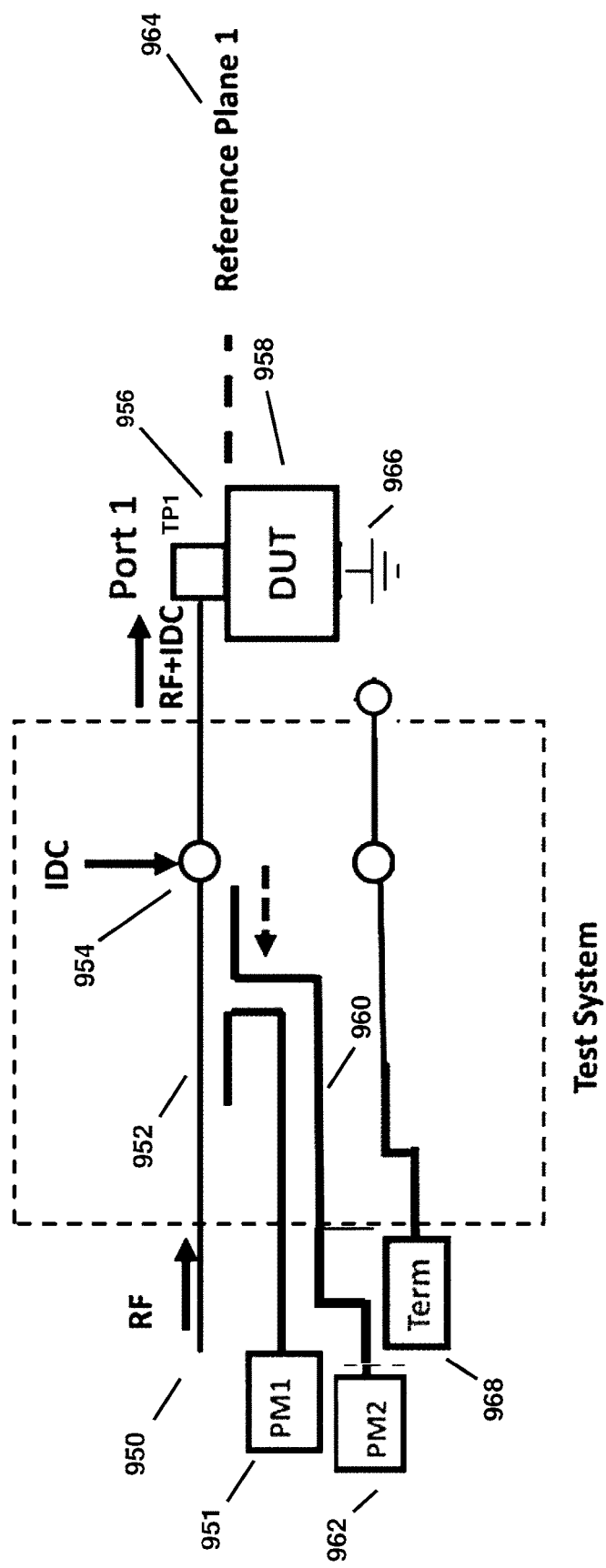
FIG. 10 shows the test signal flow in the reflection mode.

FIG. 10 shows the test signal flow in the reflection mode. The input arrangement is similar to the transmission mode. The forward power at the RF test signal input 950 is sampled by an internal coupler 952 and is samples at the input power at sensor 951. The RF signal is then added to the DC stress at 954 using a bias tee to feed the test module 958, containing the device under test. The combined signals pass to the DUT through port TP1, 956. The RF signal is terminated in the DUT and the reflected signal passes back through the bidirectional coupler. 952 and measured at the sensor, 962. In the reflection mode, the input RF and DC current are connected to the ground terminal, 966. The second port of the test module, FIG. 1 is not used and terminated in a 50-ohm load, 968. The physical connections are further clarified in FIG. 11 and FIG. 12. There is only one reference plane, 964 calibration in this mode. With the calibration corrections the ratio of the two power levels 962 and 951 provides the reflection coefficient (or S11). The DUT resistance is de-embedded from test module measurement. When the DUT resistance is close to the characteristic impedance of the transmission lines (50 ohm), the ratio or S11 measurement is much more sensitive to resistance changes and the system is able to discern much smaller percentage resistance changes in the DUT. The reflection mode is more accurate under these conditions, as more fully described in FIG. 26.

Figure 11:
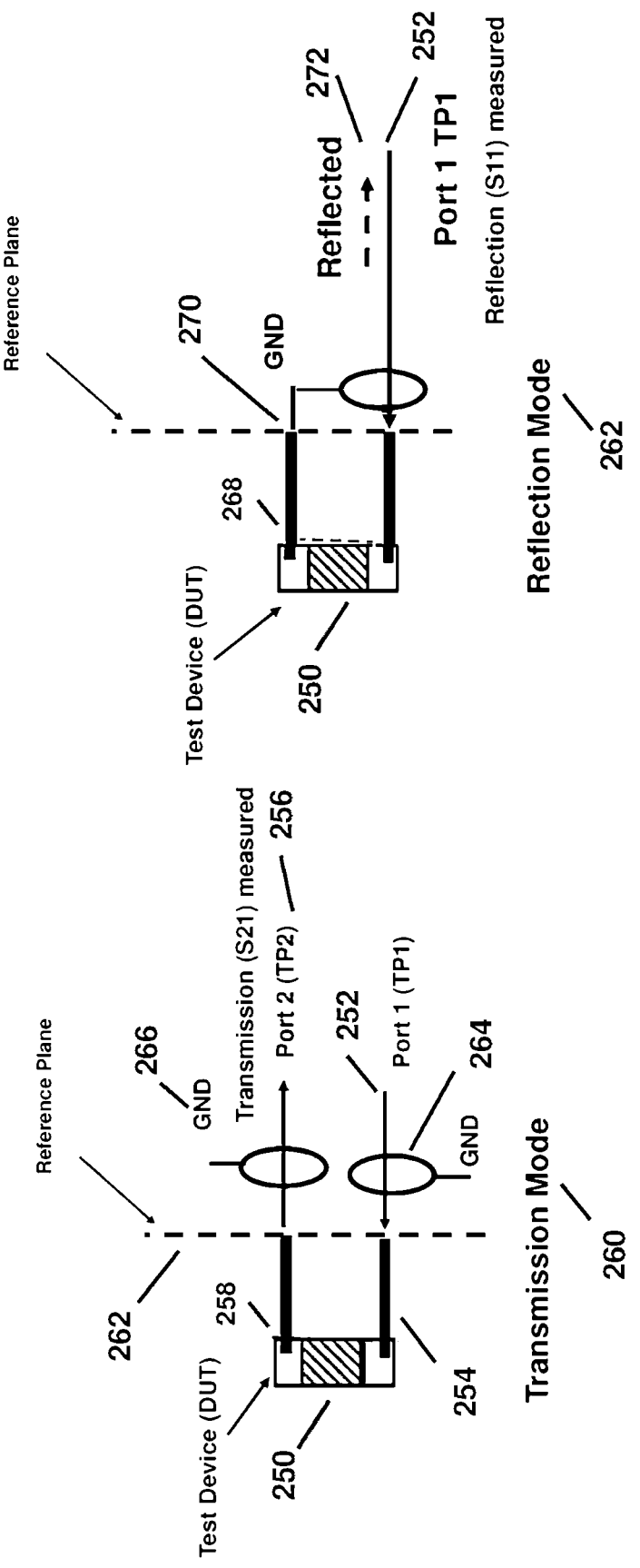
FIG. 11 shows the physical connections to the test die 250 being stressed in the transmission and reflection modes.

FIG. 11 provides more detail on the physical connections to the test die 250 being stressed in the transmission and reflection modes. In the transmission mode 260, one pad of the test die is connected to the input test signal, 252 using a wire bond 254 and the second die pad 258 is connected to the output test port 256. For accurate RF characterization, the location of the electrical reference plane 262 must be established in the calibration process. The common electrical grounds 264 and 266 is shared with the connecting cables. The grounds further extend to the coplanar transmission lines on the flexible substrate as seen in FIG. 1. In order to make accurate RF measurements on the test die, wire bond inductance and RF parasitic associated such as fringing capacitance associated with the terminated transmission lines must be taken into account. These parasitic elements can be de-embedded in the measurements using known standard die such as chip resistors, in place of the test device 250.

The reflection mode 262 has similar assembly construction except that the wire bond 268 to the second pad is made directly to the common system ground, 270. The input test signal 252 is measured the same way but the reflected power 272 is measured using the directional coupler integrated within the test system. Accurate measurements are also obtained by using know calibration standards in place of the test die which can be de-embedded from the test module.

Thus, in some transmission mode embodiments, the DUT test equipment and at least one RF test port comprises at least a first and second RF test port, and the DUT test equipment operates by RF signal transmission mode between at least the first RF test port and the second RF test port. Often, this DUT test equipment will use the RF test ports to transmit and receive at least some RF signals with a frequency of 10 MHz or greater. The system is also capable of simultaneous DC and RF testing.

Alternatively, in some reflection mode embodiments, the DUT test equipment operates in RF signal reflectance mode over at least one RF test port and the ground.

Figure 12:
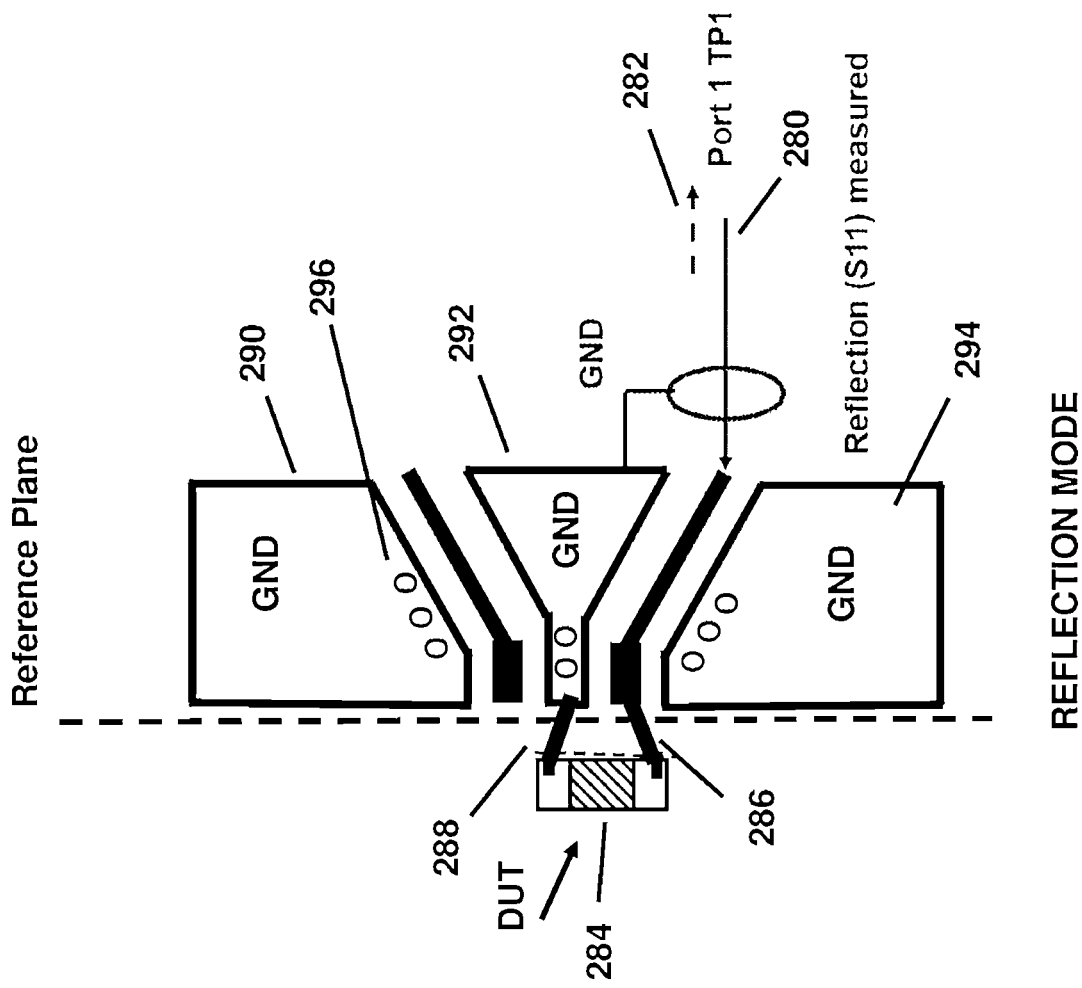
FIG. 12 shows further detail on the wire bond configuration in relation to the system common ground and the test die

FIG. 12 shows further detail on the wire bond configuration in relation to the system common ground and the test die 284. The common ground is shared from the bottom metallization of the flexible film and the top surface grounds 290, 292 and 294 using multiple conducting via holes 296. This arrangement (or coplanar) structure ensures continuity of the common system ground and allows accurate definition of the test reference plane. In the reflection mode, the input test signal is applied at port TP1, 280, which connects to the first pad of the test die at 286. The second pad 288 is attached to the common ground. The reflected signal 282 is measured at the sample port described in FIG. 10.

Figure 13:
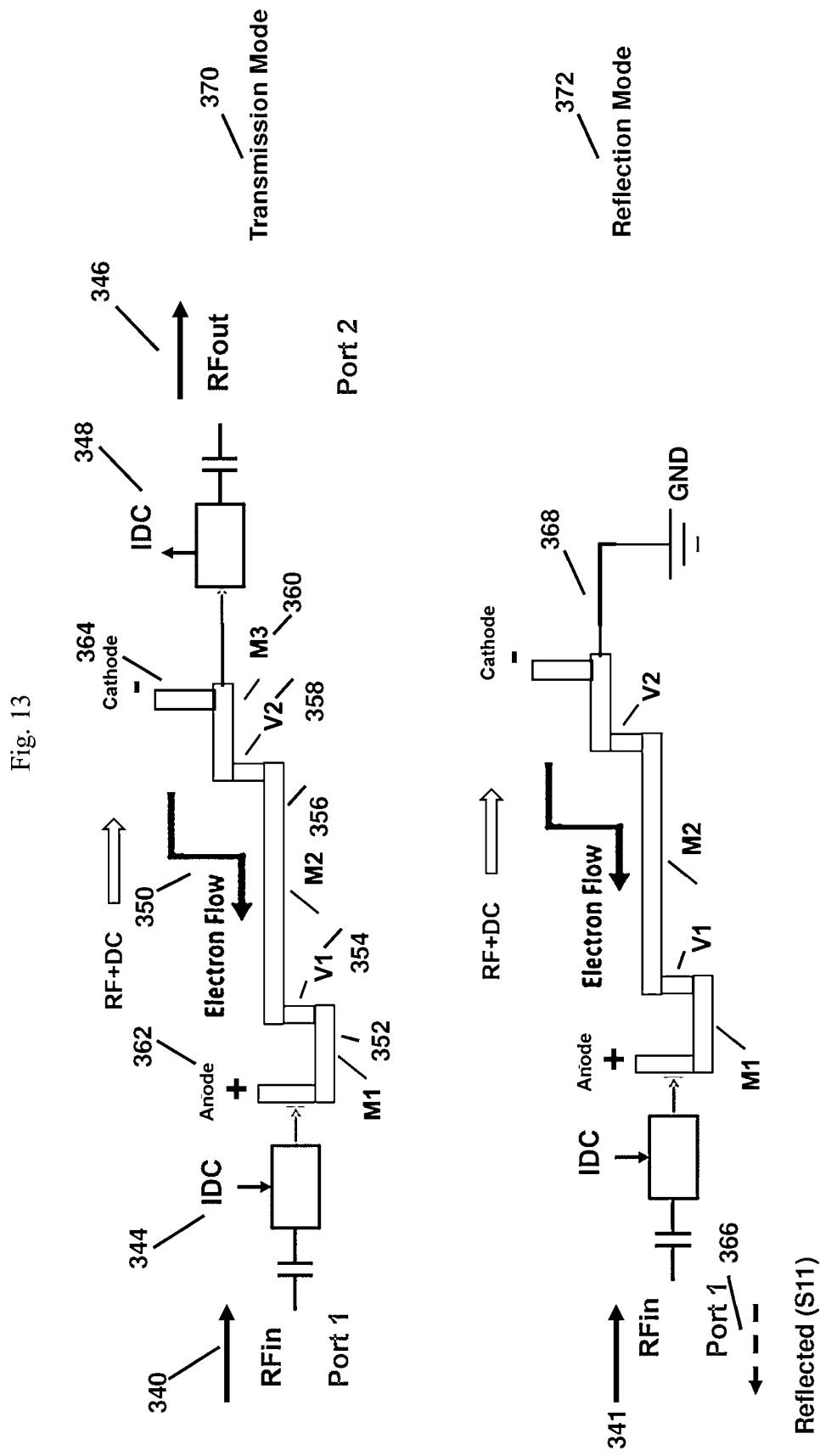
FIG. 13 shows an example of the internal structure of a typical test die.

FIG. 13 shows an example of the internal structure of a typical test die. The test device has three metal traces 352 (M1), 356 (M2) and 360 (M3), which are separated by two dielectric layers (not shown). The dielectric layers provided electrical isolation between the metallization layers. The metal traces are connected using two metalized via connections 354 (V1) and 358 (V2) to provide a continuous conducting path between the anode, 362 and cathode 364. To clarify the expected electromigration process the direction of DC electron flow is indicated at location 350. Under RF stress conditions the electron flow alternates directions.

In the transmission mode 370, the RF, 340 and DC, 344 stress signals enter at the anode pads and are respectively terminated at the output cathode pad at 348, through paths DC (349) and RF (346). Electromigration can occur in a number of locations such as the traces 356 or the transition between the trace and conducting vias 354 and 358. This example is provided as a reference. Other structure and configurations can be derived in a similar manner.

In the reflection mode 372, the structure behaves in a similar fashion except that the RF and DC currents are terminated in the common system ground 368. Also, the RF resistance is instead measured using the reflected power from the device under test.

Figure 14:
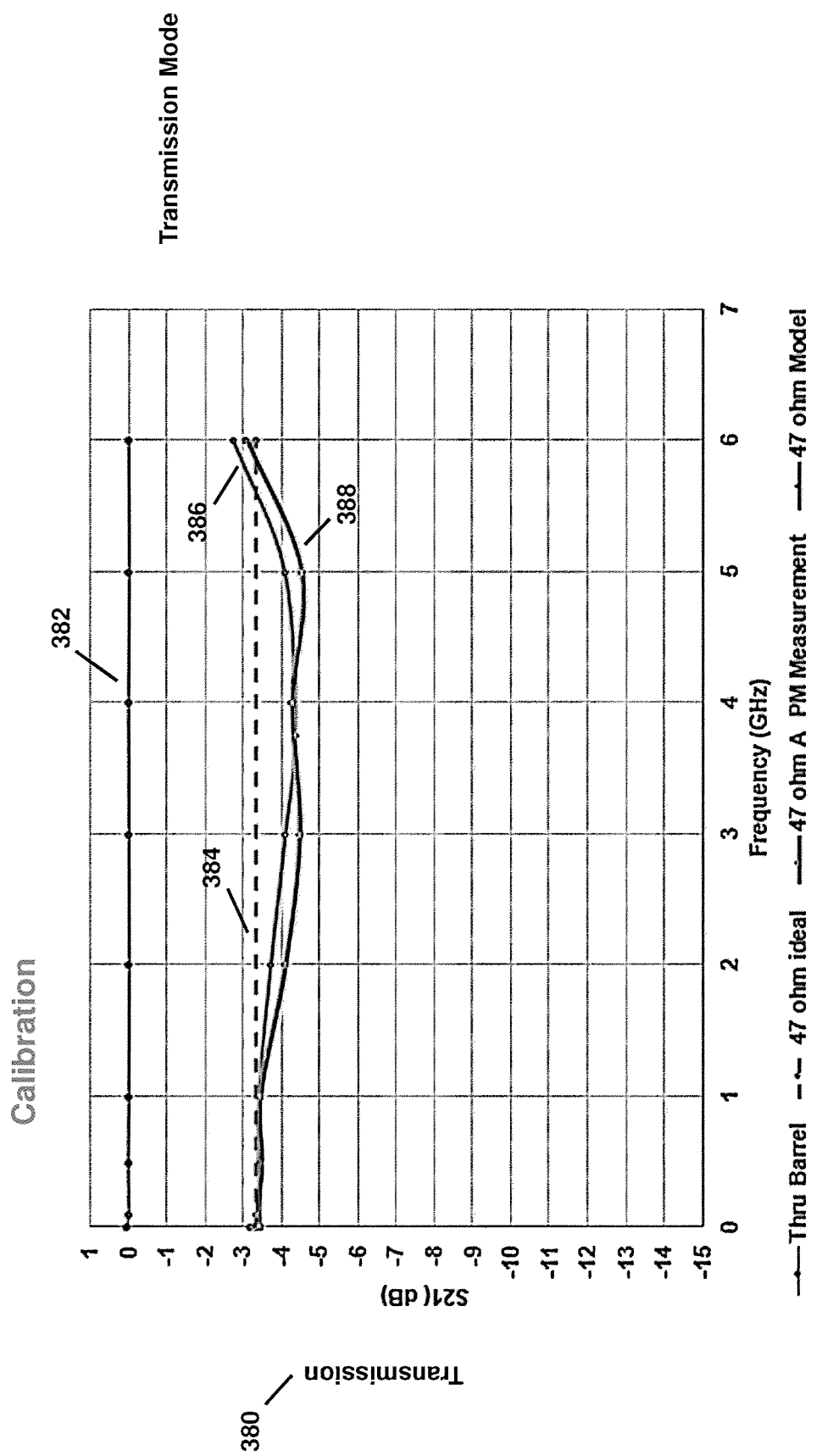
FIG. 14 shows an example of the test system used in the transmission mode, where a calibrated system measures the transmission loss 380 on a known reference devices such as a 47-ohm resistor and compares the results with a simple model to confirm the measurement method.

FIG. 14 shows an example of the test system used in the transmission mode, where a calibrated system measures the transmission loss 380 on a known reference devices such as a 47-ohm resistor, and compares the results with a simple model to confirm the measurement method. The measurements are from DC to 6 GHz but can be extended to higher frequencies with the same methodology. In the simplest configuration, where the two test ports are directly connected to one another, there is no loss as confirmed by the plot 382, as expected. The other examples show the predicted behavior of an ideal 47-ohm resistor (no parasitic components) 384 compared to calibrated measurements 388 and an electrical model 386 that includes parasitic behavior, which is in close agreement to verify the measurement methodology.

Note that RF devices typically handle RF sine wave signals. By contrast, digital devices handle RF frequency digital waveforms, which can be understood as RF frequency square wave signals.

It is to be expected that each type of input and output signal, as a function of time, may impose different types of stress and subsequent changes or damage to the DUT chip itself. In particular, the "sharp" edged square wave signals can impose more stress on the chip components, relative to the gentler RF sine wave signals. Thus, for more accurate stability modeling, it is important to challenge at least some types of DUT, such as digital DUT, with square wave type signals that subject the digital DUT to a more realistic type of input and output signal stress.

This information can be used as input to digital DUT chip designers to improve the reliability of their designs. This can be particularly useful for computer processors, AI chips, and other types of chips (digital DUI) that employ digital circuitry.

Figure 15:
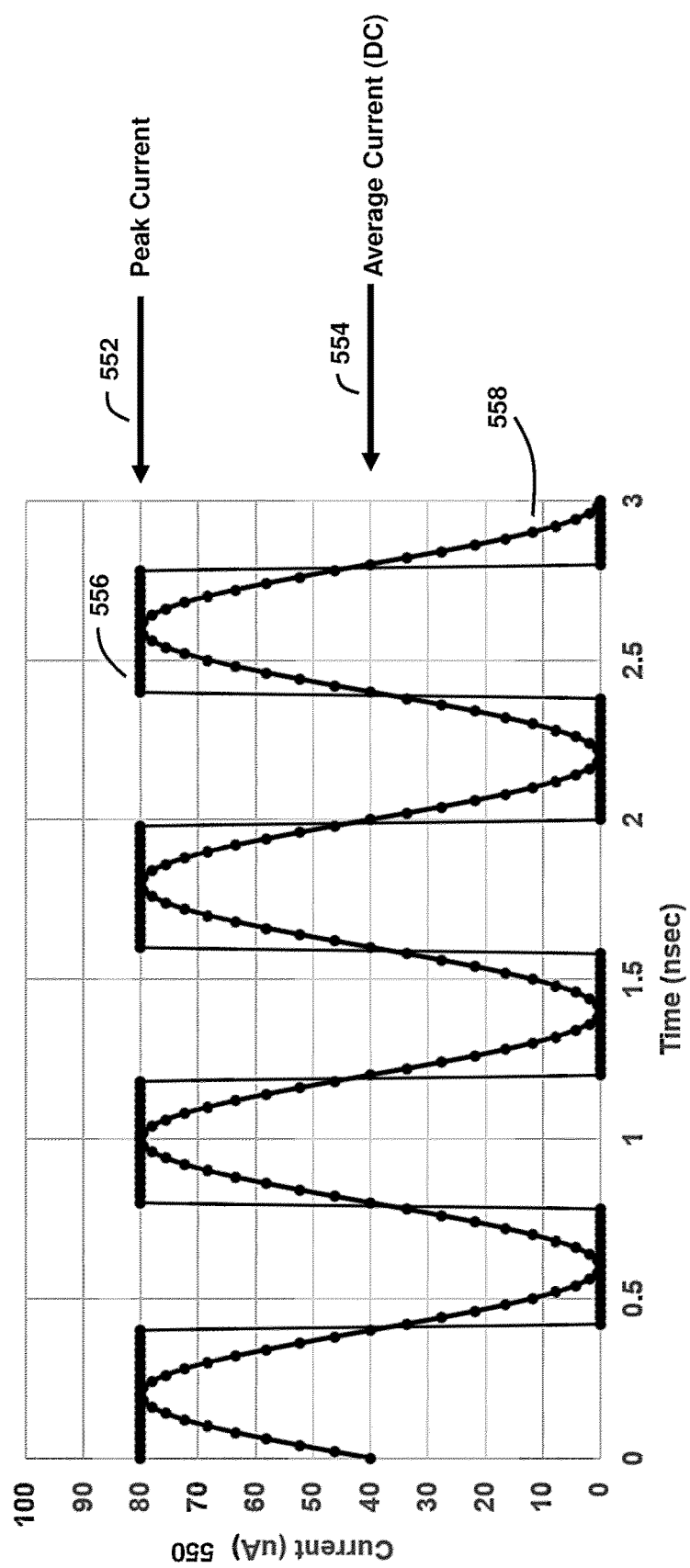
FIG. 15 shows that the test system can provide custom waveforms that combine DC and RF stress conditions and can create conditions expected in device operation in digital and RF applications.

FIG. 15 The test system can provide custom waveforms that combine DC and RF stress conditions and can create conditions expected in device operation in both digital and RF applications. In the case shown in FIG. 15, the test signal, 550 has a set DC level and a fundamental RF frequency at 1.25 GHz. The DC level 554, (or average current, 40 microamp), is set equal to the peak value of the RF fundamental signal,558, resulting in a peak stress value, 552 that is twice the average current (or 80 microamp). The waveform current has a net positive value. This waveform is representative of what is experienced for an RF signal in a power amplifier or a digital switching application. The test signal 558 is compared to an ideal digital switching waveform, 556. The test system architecture allows other modifications as are encountered in advanced integrated circuits.

Such custom waveforms [produced by employing Fourier analysis to approximate the desired test waveform (such as a digital signal (or by other methods.

Figure 16:
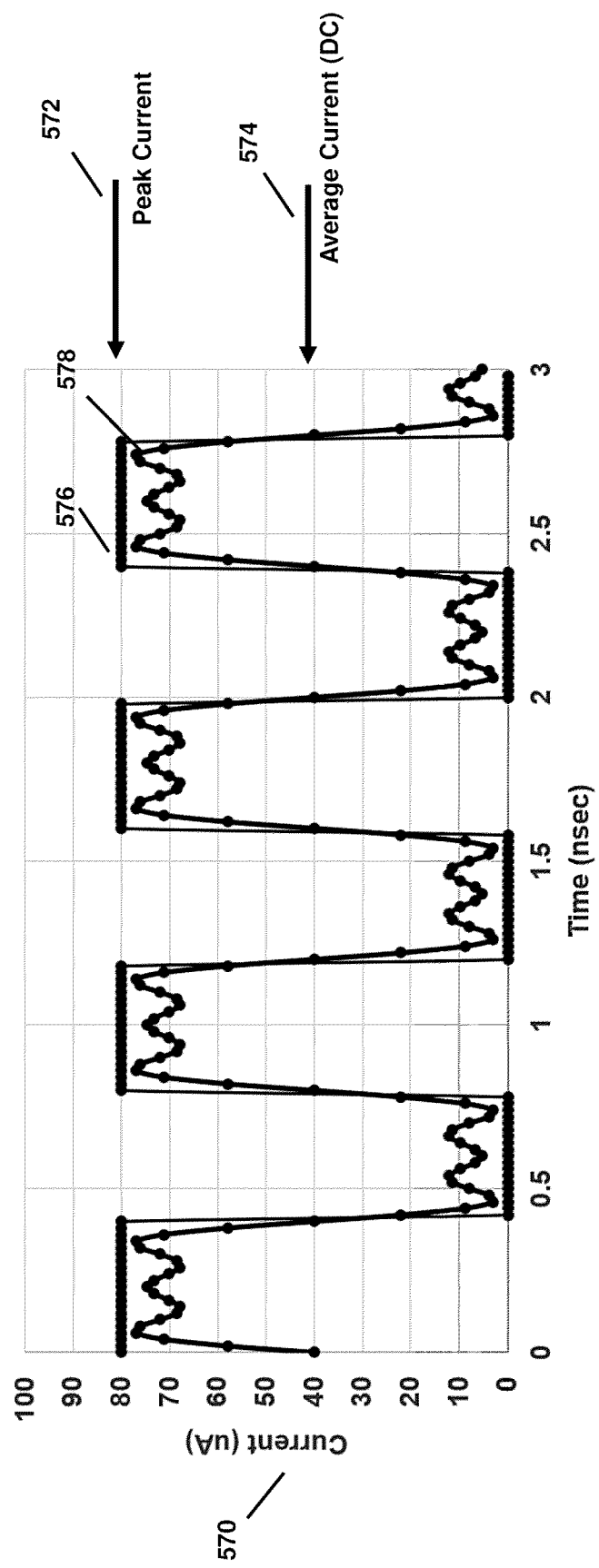
FIG. 16 shows another example, 570 of DC and RF stress in which the RF signal contains harmonics to the 5th order, also at a fundamental frequency 1.25 GHz.

FIG. 16 shows an example of electromigration test waveforms and DC and RF stress compared to harmonic approximations. According to Fourier analysis, a square wave (similar to those used in digital switching arrangements) can be approximated by a series of simpler sinusoid waveforms at different frequencies. The system can also simulate digital square wave effects by injecting a plurality of sinusoidal waveforms at different frequencies (e.g. harmonic frequencies). This can provide information that can be useful for enabling the stability of various digital circuits.

In this context, note that other embodiments encompass the electromigration robustness of advanced high-speed computing (HPC) devices and graphical processors (GPU) that form the backbone of artificial intelligence (AI) applications and next generation data centers. Single chip GPU devices can dissipate in excess of 400 Watts distributed to over 8000 cores. Each core typically operates at 1-2 GHz clock rates or higher, and present significant challenges to power distribution networks within the processor core array. Each individual core can require as much as 50-100 mA current and the corresponding current density within the power distribution networks increases dramatically. As the performance for these HPC processors continues to improve, the risk of electromigration failure grows and with it a reduction of system reliability. The test methodology and associated test waveforms (FIG. 13 and FIG. 19) are directly applicable to the back end of line (BEOL) processes used to fabricate this class of HPC processors.

Put alternatively, in some embodiments, the high-frequency RF integrated circuits (DUT) may be a digital circuit (digital-DUT) type DUT that is configured to respond to high-frequency square-wave type digital inputs. In such embodiments, the invention may be further used to perform accelerated testing of said digital-DUT by using a range of RF frequencies configured to approximate (often according to Fourier analysis) these high-frequency square-wave type digital inputs.

As previously discussed in FIG. 13, also note that these techniques are useful for analyzing the electromigration robustness of many types of devices, including the advanced high-speed computing (HPC) devices and graphical processors (GPU) that form the backbone of artificial intelligence (AI) applications and next generation data centers.

For example, single chip GPU devices can dissipate in excess of 400 Watts distributed to over 8000 cores. Each core typically operates at 1-2 GHz clock rates or higher, this presents significant challenges to power distribution networks within the processor core array. Each individual core can require as much as 50-100 mA current and the corresponding current density within the power distribution networks increases dramatically. As the performance for these HPC processors continues to improve, the risk of electromigration failure grows, and with it, a reduction of system reliability. The test methodology and associated test waveforms (FIGS. 13 and 19), such as using a plurality of waveforms that can approximate the square waves more commonly used in digital circuits, are directly applicable to the back end of line (BEOL) processes used to fabricate this class of HPC processors.

Put alternatively, FIG. 16 shows another example, 570 of DC and RF stress in which the RF signal contains harmonics to the 5th order, also at a fundamental frequency of 1.25 GHz. In this case, the RF peak level, 578 is set equal to the DC level, 574. The net current is again in the positive direction. The combined test signal more closely approximates the ideal switching waveform, 576. The advantage using RF signals is that power measurements of the fundamental and its harmonics can be performed with sensitive RF test equipment with high dynamic range, such as spectrum analyzers. This allows the system to produce (and analyze) high-frequency square-wave type digital inputs.

Figure 17:
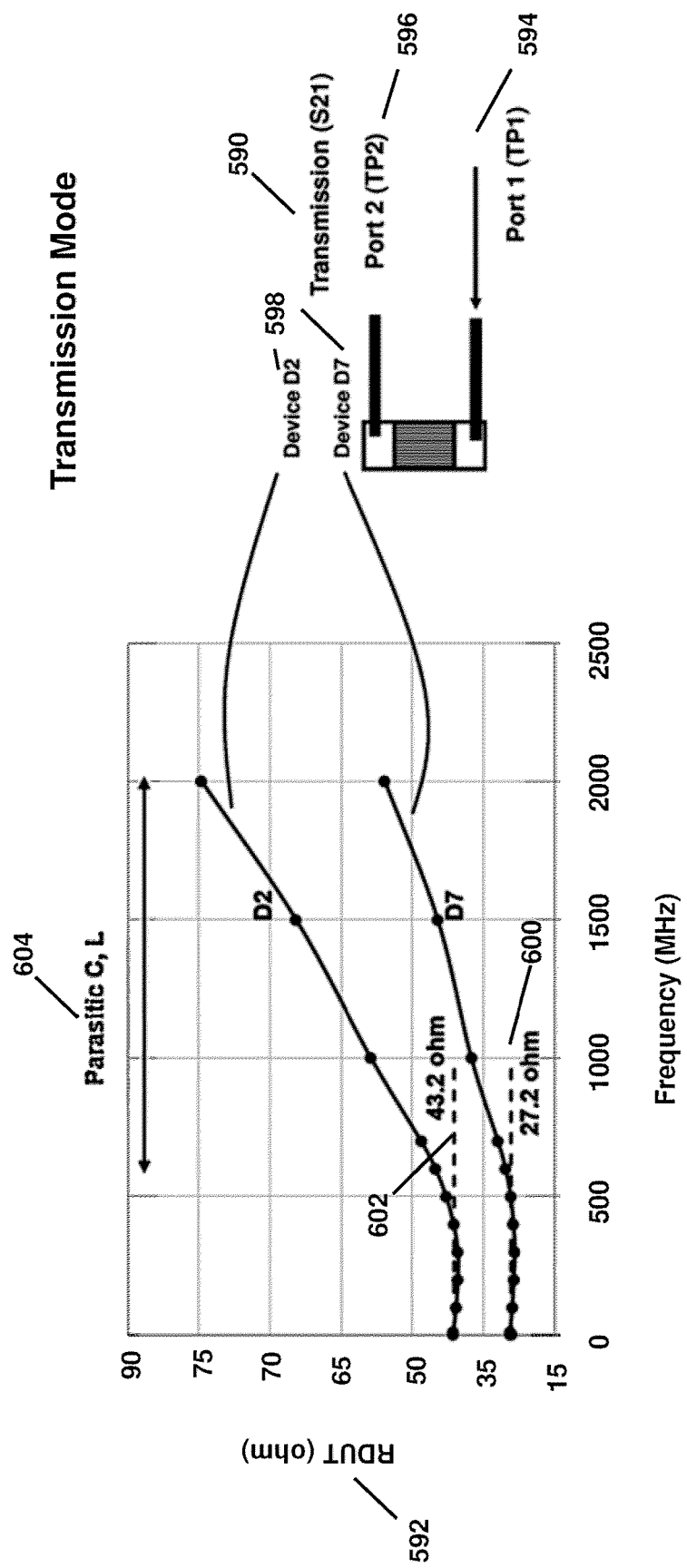
FIG. 17 shows a measurement example of RF test data, 592 from the system operating in the transmission mode, 590, prior to applying temperature and electrical stress.

FIG. 17 shows a measurement example of RF test data, 592 from the system operating in the transmission mode, 590, prior to applying temperature and electrical stress. The input RF test signal is applied at Port 1 (TP1), 594 and the transmitted power through the device under test (DUT) is measured at Port 2 (TP2), 596. The plots are intended to demonstrate the dependence of DUT behavior a function of frequency and in its initial state. Assuming ideal DUT behavior (no parasitic elements), the value of the resistance of the devices under test, 598 is inferred from RDUT=2*Zo*(1/S21-1), where Zo is the characteristic impedance of the transmission line system (50 ohm) and S21 is the ratio of the DUT output power to input power. Two devices D2, 602 and D7, 600 agree closely with their DC measurements at lower frequencies (~500 MHz). At higher frequencies, there is significant deviation due to parasitic inductance from bond wires and the internal capacitance of the DUT, 604. Modifications to the test structure can minimize contributions from the internal parasitic components.

Figure 18:
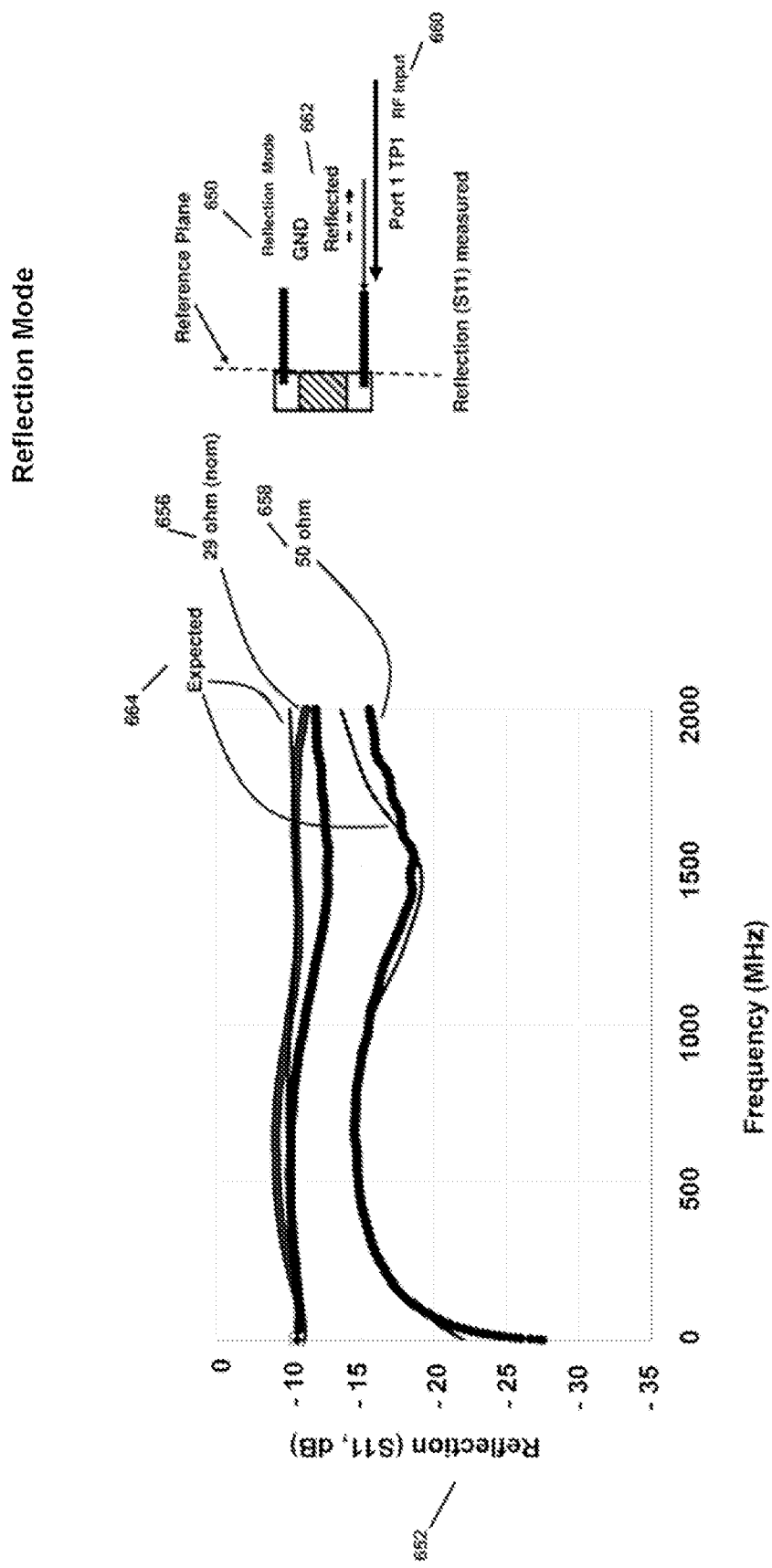
FIG. 18 shows a measurement example of RF test data, 652 from the system operating in the reflection mode, 650, prior to applying temperature and electrical stress.

FIG. 18 shows a measurement example of RF test data, 652 from the system operating in the reflection mode, 650, prior to applying temperature and electrical stress. The plots are intended to demonstrate the behavior of test devices with frequency. In the reflection mode, the input RF test signals is applied at Port 1 (TP1), 660 and the reflected RF signal from the device under test (DUT), 654 is measured also at Port 1, 662, using the internal direction coupler within the control module. The reflection (S11), 652 is a measure of the ratio of the reflected RF signal to its input RF value. The example shows the behavior of a reference chip resistor (50-ohm, nominal value), 658 and a test device (DUT) that has a nominal DC resistance of 29 ohm, 656. Both devices have inductance contributions from wire bond but the DUT, 656 has additional internal capacitance. The measurement illustrates that for test devices with lower resistance in the 50-ohm range, the reflection mode has better measurement sensitivity than the transmission mode. The value of the DUT resistance can be inferred from the S11 value as described in a later example. The reverse is true for higher DUT resistance values, where the transmission mode is preferred. To confirm the frequency dependence of the device behavior, it can be seen that the predicted frequency dependence, 664 aligns well with the test subsystem measurements, when wire bond effects and DUT internal capacitance, derived from its fabrication process parameters. are included.

Put alternatively, FIG. 18 shows an example of room temperature behavior of the DUT test equipment, here operating in reflection mode, calibrating and analyzing two different types of test devices as a function of frequency. Here signal is put into port 1 (TP1) and the echo or reflected signal is also measured on port 1 (TP1) as a function of frequency. Here there is more reflection when port 1 (TP1) is connected to the ground with lower levels of resistance. Here, the system can also distinguish between two different DUT devices, each with differing TP1 to ground resistances, as a function of test frequency. This can also change in responses to the DUT structure as a function of temperature and time stress.

Note, however that in contrast to FIG. 17, which showed big differences occurring as a function of frequency mode using transmission mode, for reflectance mode, the difference between the expected value and the measured value, as a function of frequency) is relatively close.

Thus, here the baseline DUT response, as a function of frequency, can be initially assessed using both transmission and reflection measurements. Changes in this baseline DUT response, caused by changes in the structure of the DUT chip as a function of temperature and time stress, can then be assessed by comparing these baseline DUT responses to temperature and time stressed DUT responses.

These effects also can be used to calibrate the invention's test equipment. For example, in some embodiments, the DUT test equipment may be further calibrated by using calibration DUT devices wherein there is any of a short circuit, open circuit, or a defined fixed resistance between the first RF test port and the second RF test port.

In a preferred embodiment, this defined fixed resistance can be between 10 and 5000 ohms. This allows for "de-embedding" by separating out stability effects caused by any changes in the test device from any changes caused by stability changes in the DUT.

Figure 19:
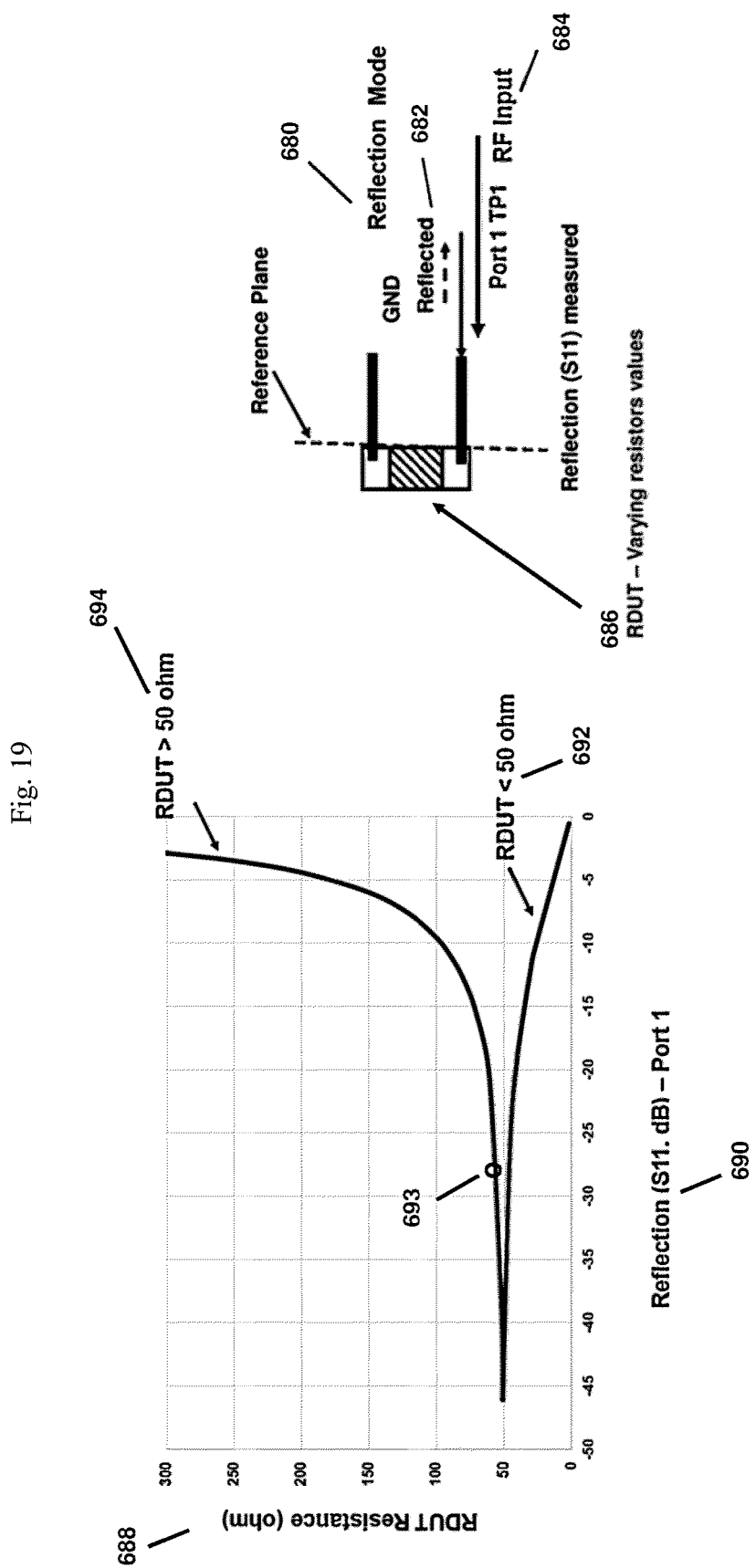
FIG. 19 shows a plot providing a reference point for using the reflection mode to measure the resistance change of the device under test (DUT), 688 for a device with nominal 50-ohm resistance at the high-temperature test condition.

FIG. 19 The plot in FIG. 19 provides a reference point for using the reflection mode to measure the resistance change of the device under test (DUT), 688 for a device with nominal 50-ohm resistance at the high temperature test condition. Under ideal conditions, the DUT resistance increases as it is heated from room temperature to the test temperature (300-450 deg C.) that is necessary to induce electromigration. Once a stable high temperature is reached, further resistance changes are caused by electromigration. In the reflection mode, 680 the measurement uses the ratio of the reflected RF power, 682 to the input RF power, 684 (or S11) to track the DUT 686 resistance change. In the example, during the initial heating as DUT resistance starts from a value less than 50 ohm, 692 the reflection ratio reduces to a minimum at 50 ohm and then increases again to a stable operating point, 693 prior to electromigration. Further DUT resistance changes result in an increased reflection measurement which moves along the curve toward the region, 694 as the DUT resistance increases above 50 ohm, due to electromigration.

Figure 20:
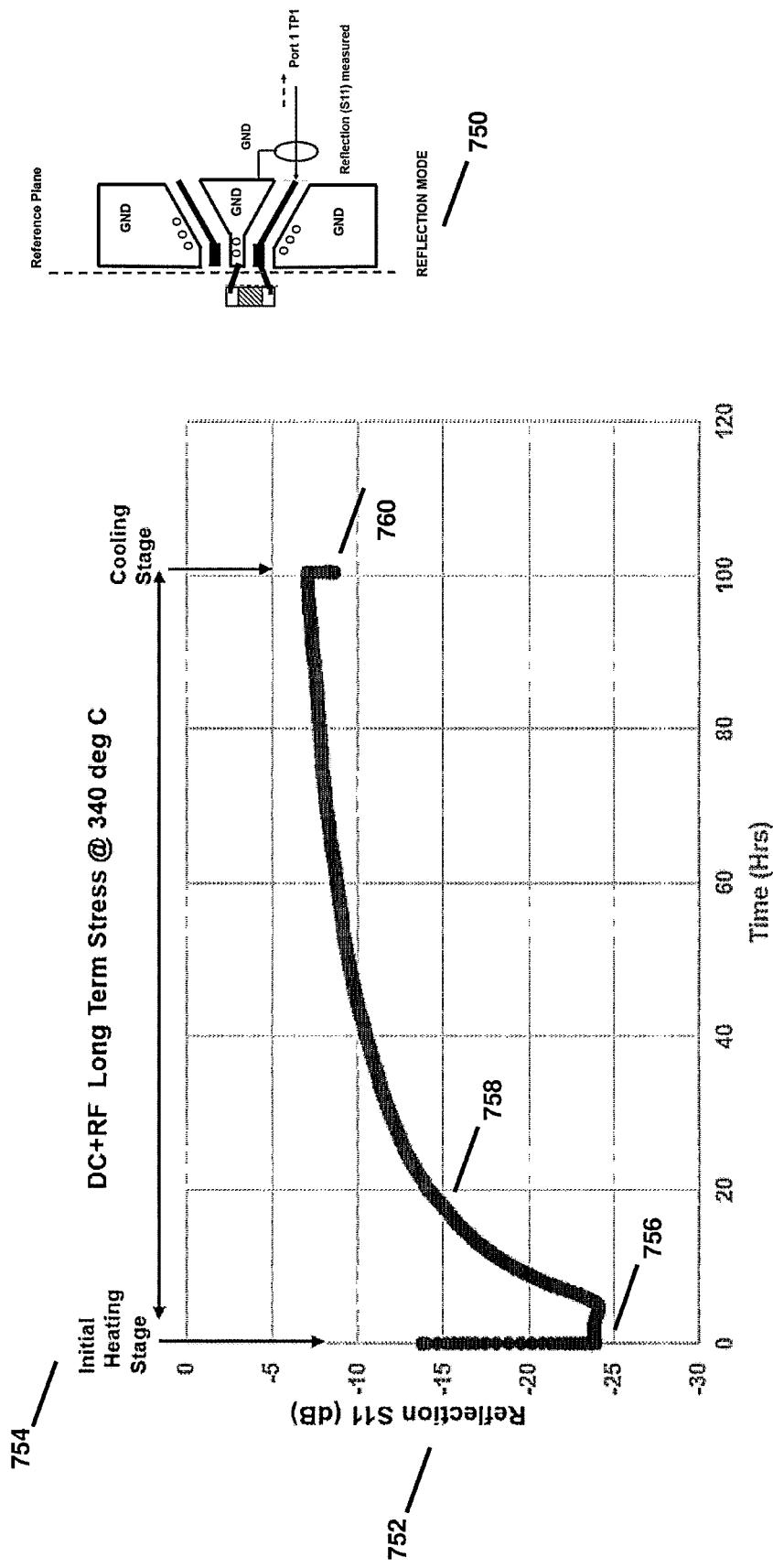
FIG. 20 shows an example of the test module and test system is shown for a device consisting of 110 metallization traces in parallel with each trace being 65 nm wide. The reflection (S11) is shown as a function of stress time.

FIG. 20 An example of the test module and test system is shown for a device consisting of 110 metallization traces in parallel with each trace being 65 nm wide. The device is stressed at 340 deg C. and is tested in the reflection mode, 750, with DC and RF stresses at 1.25 GHz and the reflection (S11) as a function of time, nomina; 100 hours. The electrical stress excitations are applied to a single bond pad that feeds the trace array. The low thermal mass test module allows tracking reflection from the device, 752 over a 100-hour period, which proceeds in four phases. In the initial phase 754 during which the DUT reaches the steady state, high temperature condition (340 deg C.). The initial phase is relatively short (minutes) and the reflected signal lowers, as the DUT resistance changes due to its temperature dependence. In this example, the change corresponds to a change of approximately 30 ohm to 50 ohm, where the reflection is minimum, 756. In the second phase, the reflection stays relatively constant, 756 until about 5 hours at which the device enters the electromigration state, 758. As successive traces experience electromigration damage, the current increases in the remaining traces until the DUT reflection and related resistance value saturates. In the final phase, 760, the device is cooled down and it settles to ambient temperature, where the resistance change is permanently changed.

Figure 21:
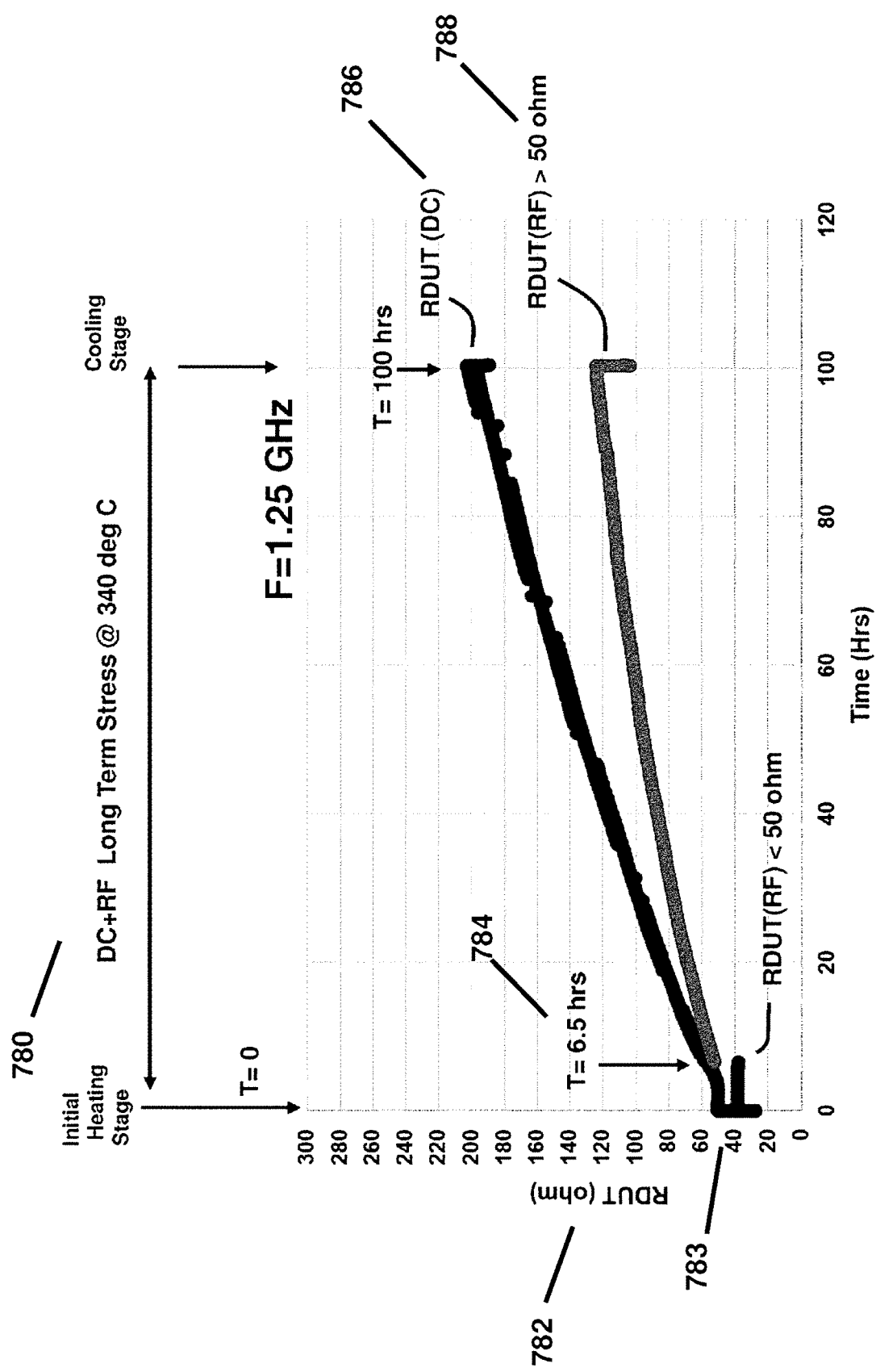
FIG. 21 shows the device resistance behavior derived from the DC and RF reflection measurements at a test frequency, 1.25 GHz over a 100-hour time frame, 780.

FIG. 21 shows the device resistance behavior derived from the DC and RF reflection measurements at a test frequency, 1.25 GHz over a 100-hour time frame, 780. The multiple trace test device described in FIG. 20 is tested in the reflected mode. Ignoring parasitic circuit elements, the RF device resistance, 782 is derived from the following relationships RDUT=Zo*(1+S11)/(1-S11) (for R>50 ohm) and RDUT=Zo*(1-S11)/(1+S11), (for R<50 ohm), where Zo is the characteristic impedance of the transmission line system (50 ohm) and S11 is the numeric reflected power ratio. More precise RF resistance measurements are possible by testing at multiple frequencies and de-embedding the effects of parasitic circuit elements. In the initial test stage, 783 the RF and DC resistance values are close but start to deviate significantly, 784 and 786, 788, as stressing continues. These results demonstrate the ability of RF stressing to isolate and differentiate underlying electromigration failure defects.

Possible interpretations of device defects can be derived from the metallization layer construction shown in FIG. 13. The electron flow injected from the cathode flows along trace 360 (M3) which experiences a sudden change due to the via transition 358 (V2) to the lower metal layer 365 (M2). The discontinuity creates a localized region that is vulnerable to initiating electromigration. The physical mechanisms will depend on the specific current density profiles, the mechanical profile of the device as well as the underlying physical properties of the metallization used in the process.

Another key feature of the test system is its ability to monitor shorter time dependent changes, which allows viewing fine grain changes in the RF resistance value in the initial stage, 784. For process characterization and qualification, the electromigration failure criterion is the time to failure (or resistance change) of the first trace. With 110 traces, in this example, the failure of the first trace will produce a very small resistance change (<0.1%), corresponding to an approximately 10% change in one trace. The measurement accuracy afforded by the RF measurement provides a key advantage over conventional DC measurements, which are more subject to the system noise floor. The RF method provides rapid feedback, leading to faster test throughput, faster process development and higher production yields.

Figure 22:
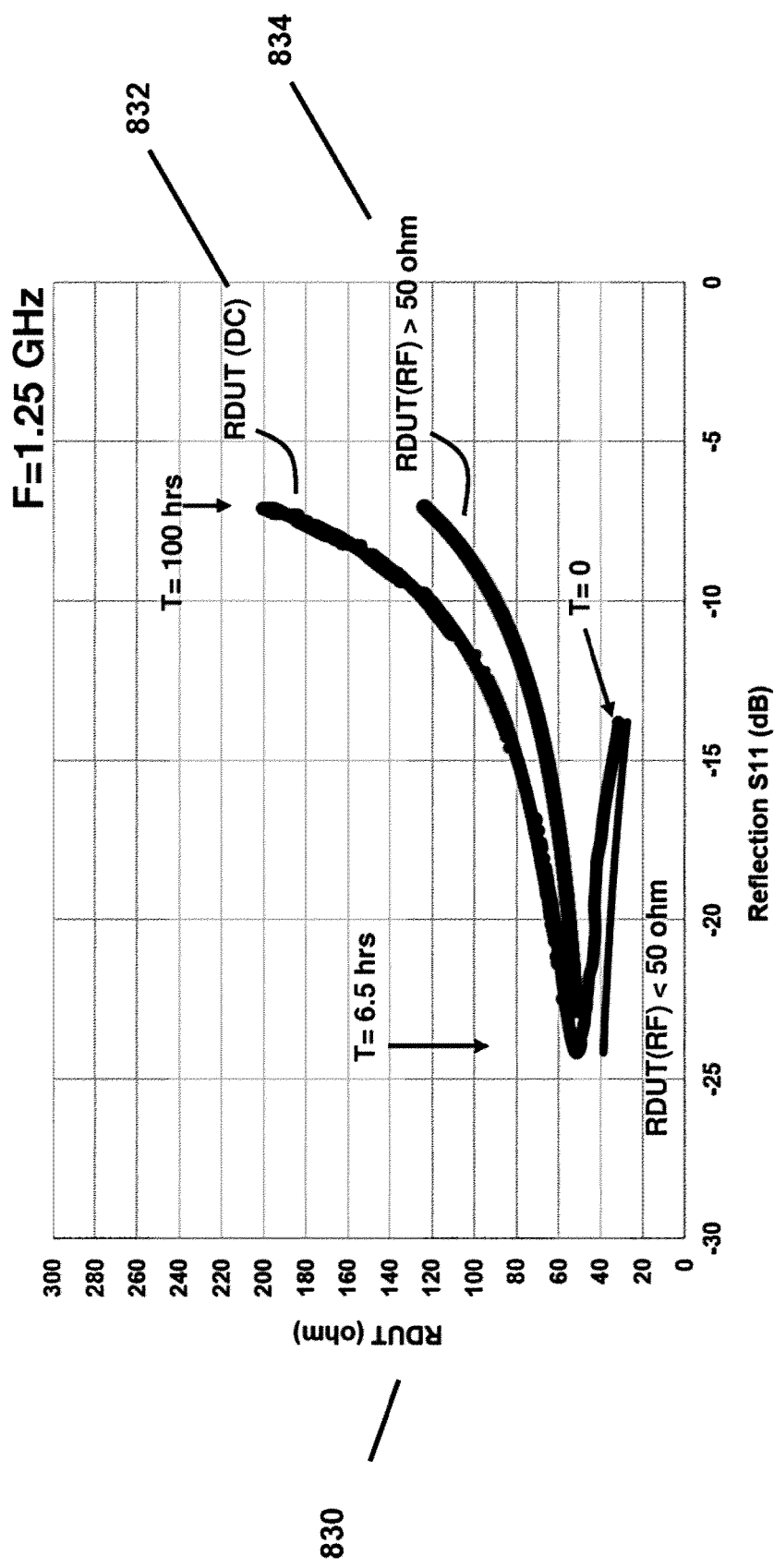
FIG. 22 shows the time-dependent resistance (RDUT) change, 830 due to electromigration when viewed as a function of return loss change.

FIG. 22 shows the time dependent resistance (RDUT) change, 830 due to electromigration when viewed as a function of reflected signal level. The data is under the same DC and RF stressing in the reflection test mode from FIG. 21. It highlights the difference between DC measurements, RDUT(DC) 832 and RF measurements RDUT(RF), 834 derived from reflection measurements. In both cases however the trend follows the behavior indicated by the ideal model of FIG. 19.

Figure 23:
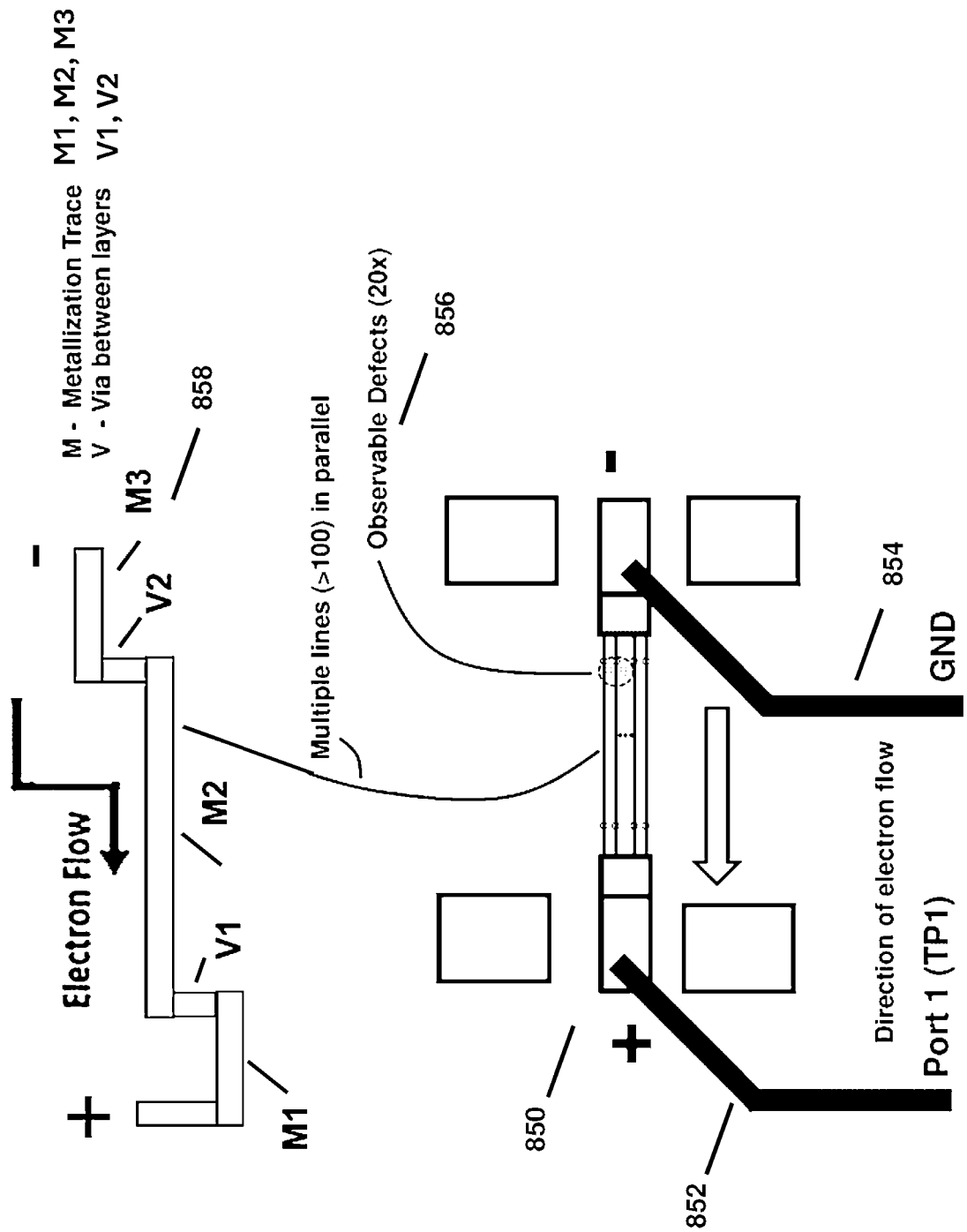
FIG. 23 shows that while electrical measurements are of primary interest in characterizing electromigration behavior, it is also important to determine the physical location where the device test structure is most vulnerable to electromigration.

FIG. 23 While electrical measurements are of primary interest in characterizing electromigration behavior, it is equally important to determine the physical location where the device test structure is most vulnerable to electromigration. Such information provides the necessary insights into the defect mechanism and methods for improving the metallization scheme. Utilizing multiple traces (>100) in parallel within a single test device has a major advantage by increasing the statistical data over a single trace measurement. However, multiple traces present a measurement accuracy challenge in that, using a resistance change of a single device as the failure condition results in an overall test device (DUT) resistance change of 0.1%. While RF electrical measurements can achieve this accuracy, new diagnostic techniques play an important role in providing insights for physically locating the defect source. Traditionally, destructive techniques are used, which are a combination of focused ion beam milling, scanning and transmission electron microscopy. Destructive diagnostics are both expensive and time consuming and are useful when there are many defects and relatively easy to locate. Where the goal is to isolate the first defect occurrence, the electrical measurement is the first phase but its location with destructive methods is much less practical, since differentiating the structures is difficult. The alternate diagnostic methods for non-destructive analysis include infrared (IR) or thermoreflectance (TR) microscopy and Raman spectroscopy (RS) methods. Of these diagnostic methods, thermoreflectance (TR) provides high spatial resolution and has the additional capability of nanosecond time resolution. A novel electromigration application of TR for a typical test structure is shown in FIG. 23. This test structure is electrically stressed at input Port1 (TP1), 852 with the ground terminal at the second device pad or negative terminal, 854. With multiple traces (>100), and pad spacing at nominal 100 microns, the observable defect area at 20× magnification is shown, 856. This magnification can be improved a novel TR imaging scheme more fully described in FIG. 24 and FIG. 25.

Figure 24:
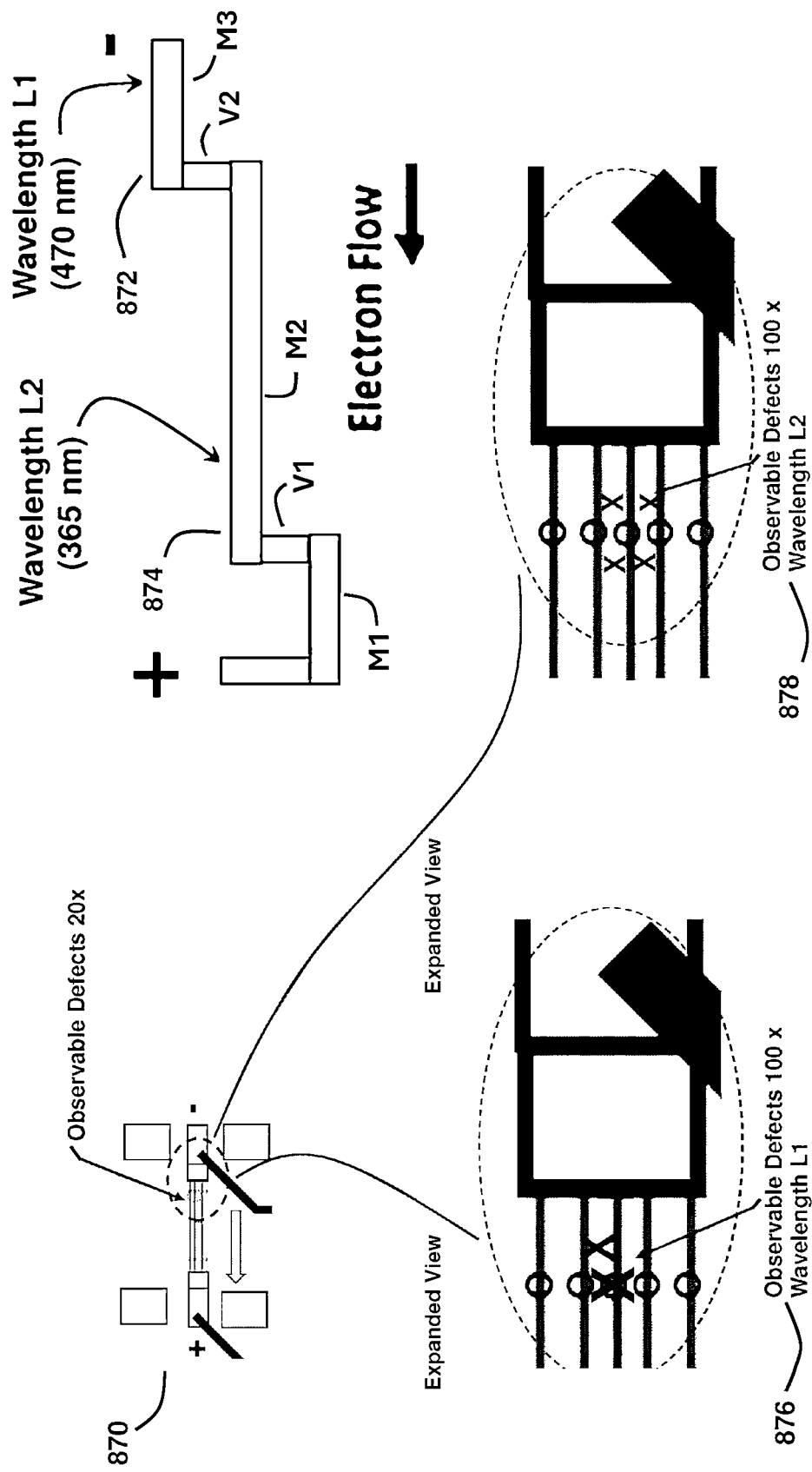
FIG. 24 shows an example of higher resolution (100×) and electron current flow in the region where electromigration is observed.

FIG. 24 shows an example of non-destructive failure imaging of electromigration test sample, 870 using TR microscopy. Thermoreflectance (TR) imaging depends on the thermal expansion difference within the test structure from temperature gradients.

For the techniques taught herein, it was found that thermoreflectance modes, such as the methods of Kendig (U.S. Pat. Nos. 10,816,401 and 10,180,359) are often better suited for nanometer (nm) scale circuit dimensions, providing both spatial and time resolution.

The differences in thermal expansion changes the amount of reflection from each location, depending on the local temperature variation. By illuminating the sample at much shorter optical wavelengths, resolution in the 300 nm range can be achieved. In the example, 872, at 470 nm wavelength, the top surface is observed. at 365 nm illumination, defects are observed in the lower metallization layers such as the location, 874. Viewed in the horizontal plane of the test device, defects can be observed at 100× magnification at each optical wavelength in areas 876 and 878 with resolution better than 250 nm. Infrared (IR) methods depend on radiation emitted from the sample and typically achieve only 1-2-micron resolution.

Utilizing TR measurements in conjunction with the highly accurate RF techniques make possible the capability to observe the occurrence of a single defects within a multiple trace structure. This feature dramatically reduces the time to observe the initiation of an electromigration defect.

Thus, in some embodiments, the invention may further use thermoreflectance imaging to determine a location on the substrate of at least some defects caused by the elevated test temperature.

Figure 25:
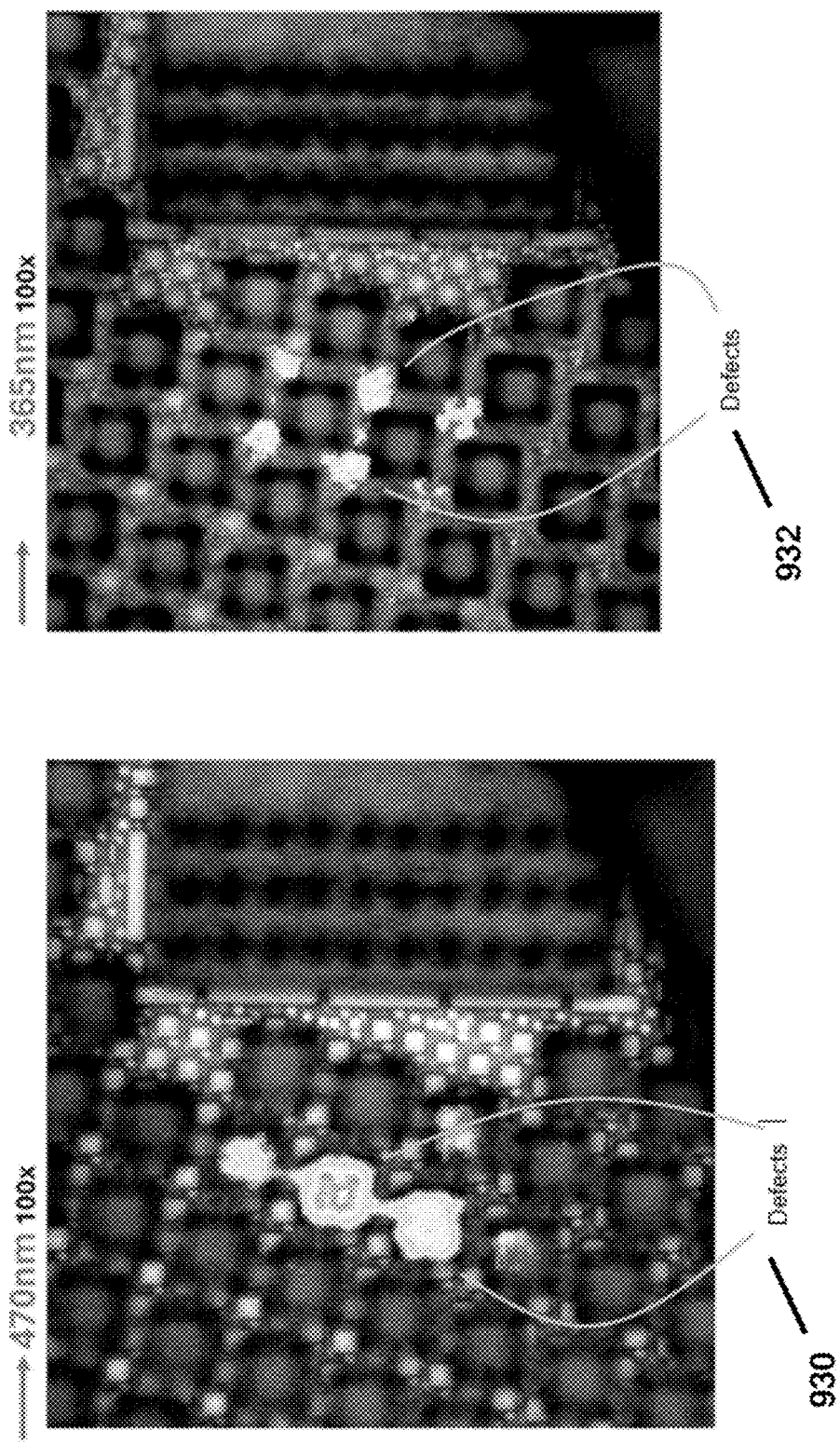
FIG. 25 gives an example of TR imaging applied to a test device with multiple traces that has been subject to RF and DC stress testing to cause electromigration test structures.

FIG. 25 gives an example of TR imaging applied to a test device with multiple traces that has been subject RF and DC stress testing to cause electromigration test structures. Case 930 shows a photograph at 100× magnification using 470 nm illumination. Case 932 is the same sample illuminated at 365 nm and identifies defect area in the lower layers of the test structure. The discrimination between defects confirms that there is sufficient to determine the formation of early defects and likely a single defect in a multiple trace array.

Note that FIG. 25 left shows differences between illuminating this part of the DUT at using light at 470 nm wavelengths, versus illuminating the same part of the DUT (right) using light of 365 nm wavelengths. Here, use of multi-frequency thermoreflectance measurements can further elucidate the nature of these defects.

In this example, the 470 nm wavelength appears to visualize the defects on the surface of the DUT chip, while the 365 nm wavelengths appear to visualize the defects somewhat below the surface of the DUT chip. This appears to support the theory that in this DUT, it is the vias between layers that may be degrading. So, this can give diagnostic information as to what parts of the chip are the most problematic from a stability standpoint.

Returning to FIG. 24, FIG. 24 shows a notional example (20×) for a multilayer structure containing over 100 parallel metal lines that are 50-100 nm in width and approximately 100 microns long. Infrared can localize defects in the 1-2-micron range, Thermoreflectance (TR) is also nondestructive and depends on the change in reflection from a surface (or expansion coefficient) with temperature.

As previously discussed, the TR method illuminates the sample with a different optical wavelengths (often around 350-450 nm) to provide higher resolution. The technique can help differentiate defects in layers. Also, The shorter wavelengths used with TR offer more than 10× better resolution than is possible with infrared (IR) methods and allows more detailed information. These ancillary TR monitoring tools can thus be used to complement the other types of RF electromigration measurements, previously discussed.

Figure 26:
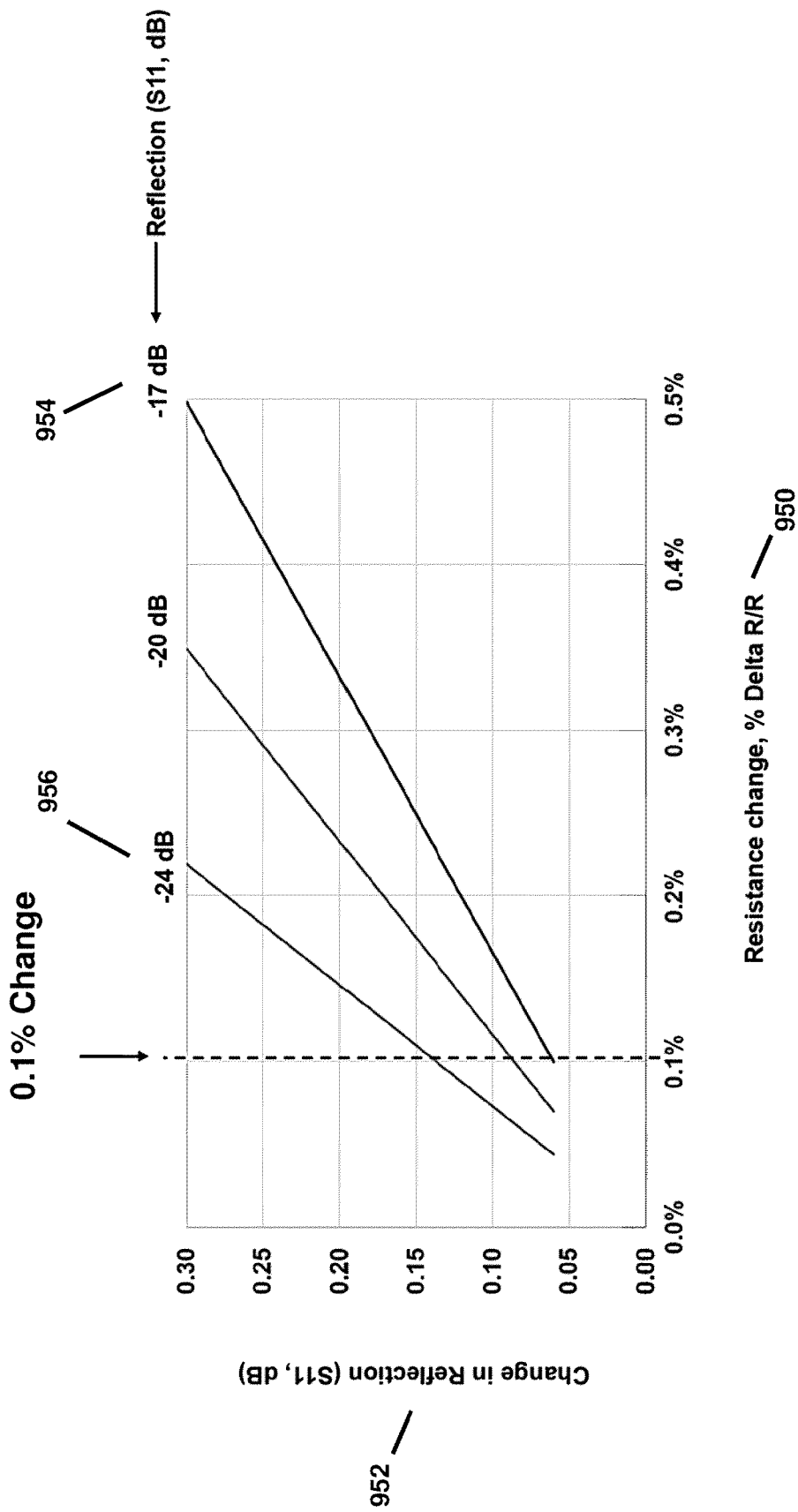
FIG. 26 shows a critical test system performance parameter in the RF electromigration testing in the reflection mode and its the sensitivity of the system to measuring resistance changes.

FIG. 26A critical test system performance parameter in the RF electromigration testing in the reflection mode is the sensitivity of the system to measuring resistance changes. With the goal of detecting resistance changes in the 0.1% range which corresponds to a single trace failure in a multiple trace array (>100 traces). The plots in FIG. 26 compare the change in reflection coefficient (dB), 972 as a function of % resistance change for several reflection coefficient values −17 db, 954 to −24 dB, 956.

If the test device has resistance closer to 50 ohm, in the example −24 dB, 956, it can be seen that the reflection change is much greater. At 0.1% resistance change, the reflection change indicates a value greater than 0.15 dB which is in the measurement accuracy of the test instrumentation.

Figure 27:
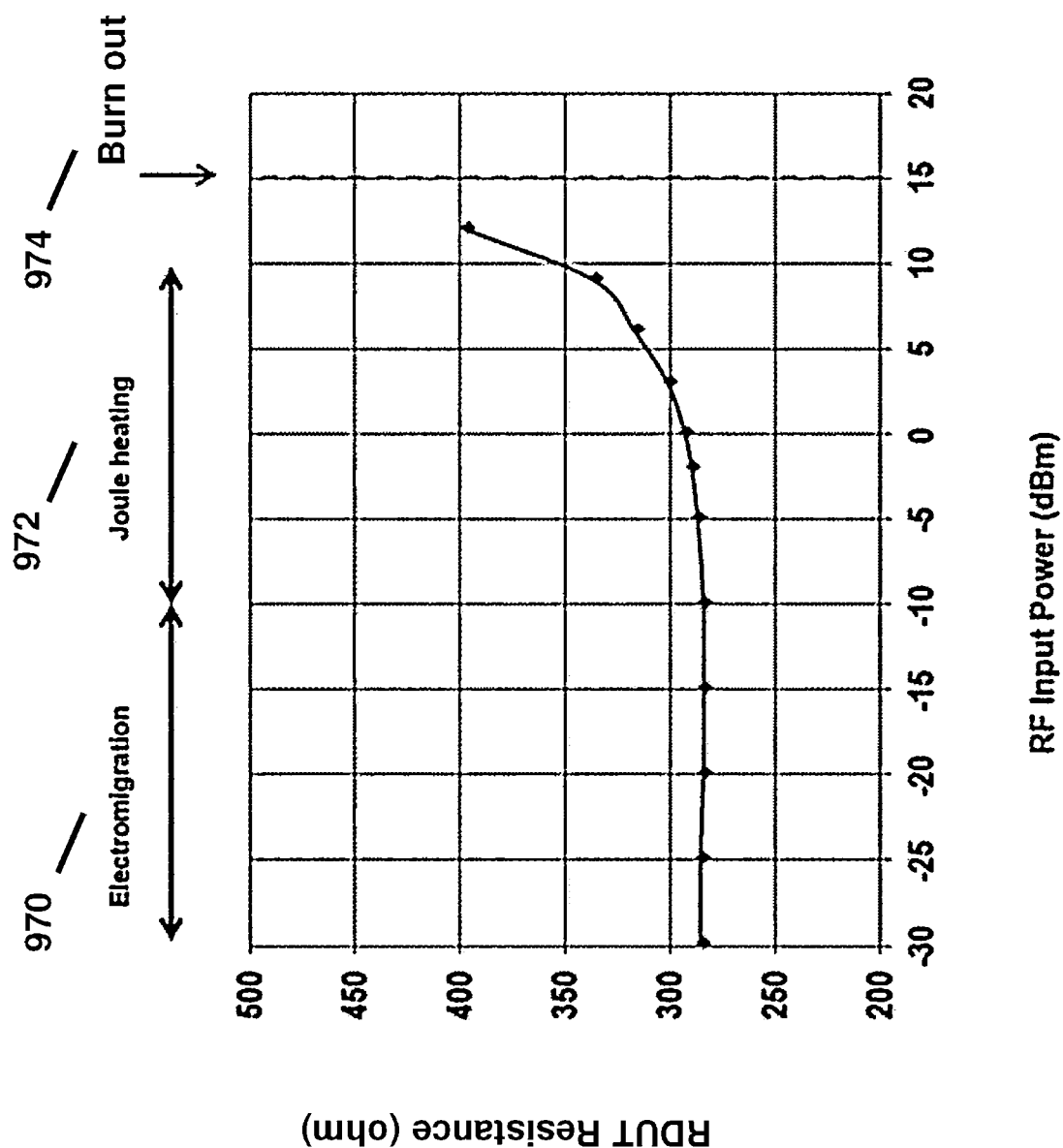
FIG. 27 illustrates another embodiment of the RF test system for characterization of nm metallization traces where RF heating can be used to elevate the test device temperature.

FIG. 27 illustrates another embodiment of the RF test system for characterization of nm metallization traces. The example shows the change of a test device resistance with increasing RF power. In this implementation the average current flowing through the device, the RF power can be used to locally heat the device. The resistance exhibits three regions: electromigration, 970, joule heating 972 and burn out 974. At frequencies conditions, where RF range does not contribute to electromigration, the RF input can be used to locally heat the device prior to applying the DC stress and can minimizes the need for external heating of the device under test. The device average temperature can be calibrated to operate below the "burn-out" and can be set in the range 300-450 deg C., after which the DC stress Is applied to create the electromigration conditions.

Figure 28:
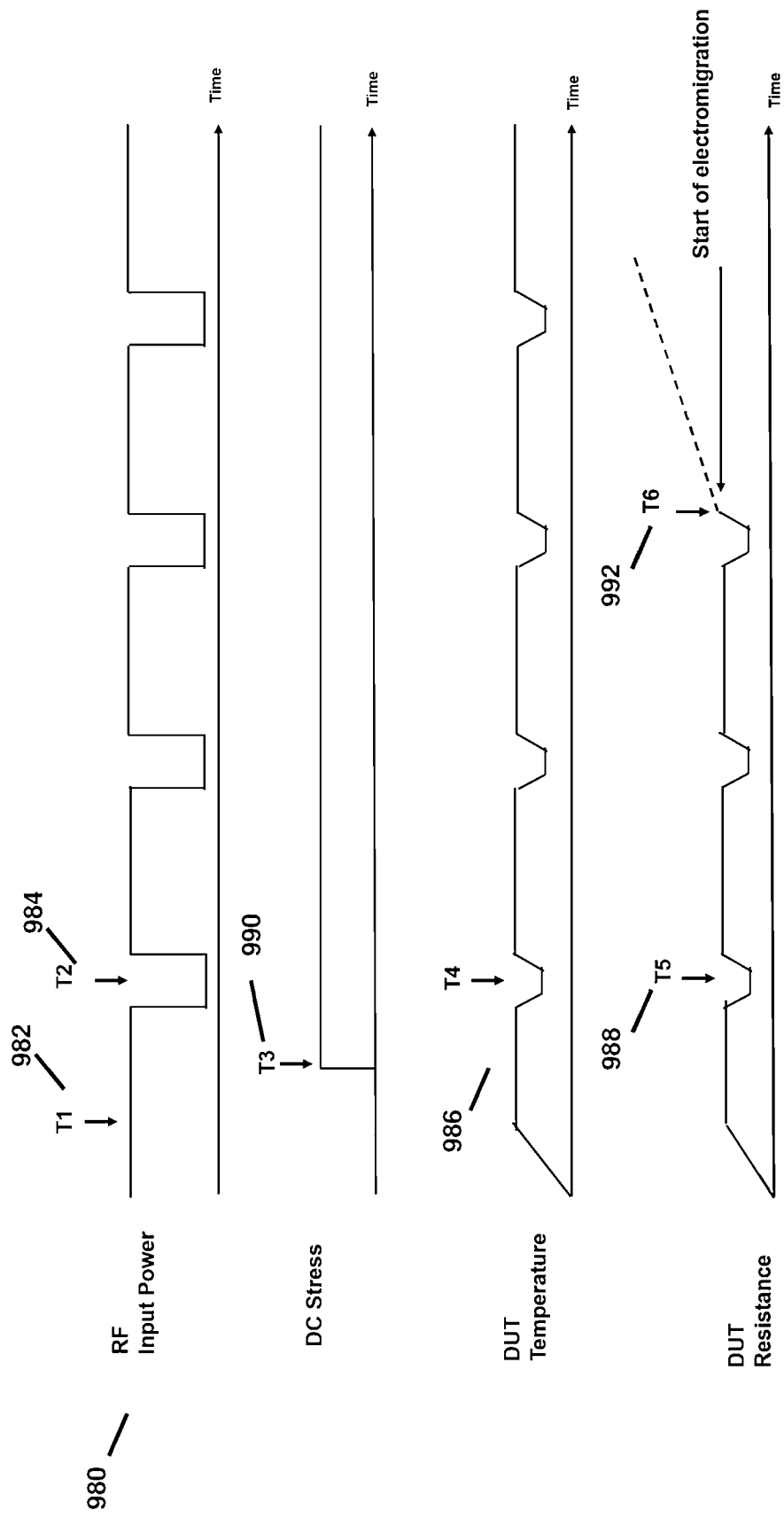
FIG. 28 shows another embodiment that takes advantage of the orthogonality between the DC and RF excitations applied to the device under test (DUT).

FIG. 28 is another embodiment that takes advantage of the orthogonality between the DC and RF excitations applied to the device under test (DUT). By independently controlling the RF signal level as explained in FIG. 27, the DUT can be rapidly heated to 300-450 deg C. using joule heating by a high-power RF excitation at a specific frequency that does not contribute to electromigration. The low thermal mass of the test structure allows temperature cycling the DUT in a short time interval (<several minutes). Since the test assembly is at ambient temperature, the DUT temperature variation can be monitored using the TR measurement technique described in FIG. 25, and is capable of resolving the temperature change with time. The higher RF power state 980, 982 is selected to set the maximum temperature, 988, while the lower power state 984 is chosen to provide maximum sensitivity to changes in resistance as described in FIG. 26. Without DC applied, the DUT state and resistance, 988 will stabilize after which the DC electromigration excitation is initiated at time 990. The sensitivity of the RF resistance change allows detecting changes in less than 5 hours stressing time 992, which will provide much better resolution than conventional DC electromigration measurement techniques.

Further Discussion:

Accelerated Testing and Novel Test Structures:

Key to improving RF electromigration technology for integrated circuits, is temperature accelerated testing. Test devices must be subjected to temperatures in the 300-450° C. range over a 5-200 hour timeframe to obtain observable behavior. Conventional RF components required to connect to test devices cannot support these extreme temperatures. Under DC conditions, the interconnection and measurement process are well-established and relatively straightforward. The proposed method to eliminate large ovens is to provide localized heating just in the area of the test device.

Thermal Isolation

An important test requirement is the thermal isolation of the device under test. Thermal isolation can be achieved through the design and selection of materials that minimize heat transfer between the high-temperature region and the measurement interface.

In one implementation, a thin insulating membrane connecting the RF circuitry is connected to the device.

The properties of the membrane are specifically selected for resistance to high temperatures. In some embodiments, the structure is selected to withstand temperatures greater than 300 deg C. for over 100 hours with minimum changes in electrical performance. Further isolation improvements can be accomplished by increasing the thermal resistance of the die support substrate by adding slots cut into the carrier plate using low-cost laser cutting, metal punching or etching techniques. These methods can significantly increase the thermal resistance.

This innovation requires validation of the materials and RF test platform. In some embodiments, the test device may be mounted on a localized heater (that is electrically powered, often using conductors on a thin polyimide film, thus forming an electrically powered heater). These coplanar RF lines are impedance matched to 50-ohm and minimize spurious reflections from the DUT. The thin film also dramatically reduces the lateral heat flow from the DUT and allows the external RF connectors to be held at room temperature. The basic integrity of this configuration has been validated.

Stress Conditions

In some embodiments, initial stress conditions may be performed under a room temperature ambient, and the power dynamic range (>45 dB) covers a wide range of RF currents, from microamp levels to the current required to fuse the trace. The RF power varies from −30 dbm to +15 dBm. The RF measurements provide superior diagnostic tools for analyzing metallization characteristics with high resolution and repeatability.

Moreover, the test configuration can subject the metal traces to independent DC and RF excitations over a broader range of stress conditions. The lower power region is typically associated with electromigration, and joule heating is dominant at high RF power conditions. As the metal thickness is at an atomic scale, measured in hundreds of atoms, the underlying phenomena and models are very complex. Supporting advanced diagnostic tools can provide additional insights. These diagnostics include SEM/TEM, IR&TR thermal measurements and other techniques. RF circuit and electromagnetic simulators for matching and modeling of the test devices to identify contributions of external inductance, capacitance and measurement contributions to the DUT behavior and its relation to the physical device structure and test fixture construction.

On-wafer measurements can be accurately calibrated and to help identify basic test circuit behavior. They can also serve to isolate subsequent packaging effects after the DUT is mounted in its test fixture for RF/DC temperature stressing. While on-wafer probing provides a useful diagnostic tool, it is not a practical method for long term electromigration analysis. The wafer prober is very expensive and there are significant uncertainties in the probes that contact the test device at high temperatures. The probe contact itself can themselves create reliability constraints due to stability and metallization damage.

The new test device structures, fixtures, test equipment and expected process improvements from the program will result in novel nanometer-scale metallization technology, providing near term benefit to US semiconductor companies and their customers. At the macroscale, electromigration can also provide significant insights into new devices such as Gallium Nitride (GaN) and Silicon Carbon (SiC) high voltage transistors that are critical to electric vehicle systems both in-vehicle, charging, energy storage and battery applications. The vehicle and battery applications also involve high current, high frequency operation. These technologies are at the forefront of the nation's reduced dependence on fossil fuels. The innovations and new test equipment will also generate university research into a wider range of nanoscale technologies, such as those used in quantum devices, which also utilize GHz frequencies.

Integrated System Example

As previously discussed, a test system may be used for measuring electromigration of nanometer metal interconnect metallization under DC and RF stress conditions. Test devices are in a PCB or on-wafer configuration and are mounted in an oven or other high temperature environment that allows temperature acceleration of the electromigration process. The DC current stress can vary from 250 microamp to 6 mA and the RF stress is up to 15 dBm over the 300 kHz to 6 GHz frequency range. Lower currents and higher RF power can be applied using additional external equipment. The system is capable of datalogging DC and RF parameters over extended periods and software control uses a proven GUI, as described in FIG. 6, and FIG. 7.

FURTHER TEST EXAMPLES

In some embodiments, the system can be configured to detect thermally induced defects using transmission and reflection type test modes. These can be chosen to optimize sensitivity of the measurement. The increased sensitivity of RF measurements can reduce the test time in production testing. The transmission mode is better suited to higher resistance devices, above 50 ohms. By contrast, the reflection mode has an advantage if the DUT is closer to 50 ohm, in which case, the RF signal reflection has a strong dependence on resistance and exhibits a sharp minimum at 50 ohms.

Note that all DUT generally also comprise a ground. This is shown in FIG. 9. Note further that as least some measurements, such as reflection type test modes, operate by monitoring reflection from a test port relative to this ground.

The invention claimed is:

1. A method of using a multi-zone test module to perform accelerated testing of high-frequency RF integrated circuits (DUT), said method comprising:
    obtaining at least one multi-zone substrate, said substrate comprising a high-temperature zone and localized heater arrangement that is configured to accept at least one said DUT and a low-temperature zone configured with RF lines that connect said DUT to at least one RF test port on said low-temperature zone;
    wherein said DUT comprises at least one input pin, at least one output pin, and at least one ground pin;
    attaching said DUT to said high-temperature zone and at least some of said RF lines so that at least some of said RF lines connect to at least some of said DUT's input, output, and ground pins;
    using said localized heater arrangement to elevate the temperature of said high-temperature zone and said DUT to a temperature above 100° C., while simultaneously using said at least one RF test port, and DUT test equipment, to evaluate at least one function of said DUT over a range of RF frequencies and time intervals.

2. The method of claim 1, further using said localized heater arrangement to elevate the temperature of said high-temperature zone to between 300 to 450° C. for a period of 5 hours or greater, while said low-temperature zone and at least one RF test port remain at a temperature under 85° C. during this time.

3. The method of claim 1, wherein said multi-zone substrate is a single substrate.

4. The method of claim 1, wherein said at least one multi-zone substrate further comprises a thermal-isolation zone disposed between said high-temperature zone and said low-temperature zone, each said thermal-isolation zone configured to minimize heat transfer from said high-temperature zone to said low-temperature zone, and wherein said RF lines that connect said DUT with at least one said RF test port further traverse said thermal-isolation zone.

5. The method of claim 4, wherein said thermal-isolation zone comprises a plurality of slots cut into the substrate to increase thermal resistance.

6. The method of claim 4, wherein said localized heater arrangement further comprises an electrically powered heater disposed on said high-temperature zone either above or below said DUT, but not in said low-temperature zone and said thermal-isolation zone, further applying electrical power to said electrically powered heater to elevate the temperature of said high-temperature zone.

7. The method of claim 1, further using said DUT test equipment and at least one said RF test port to transmit and receive at least some RF signals with a frequency of 10 MHz or greater and is capable of simultaneous DC and RF stress testing.

8. The method of claim 7, wherein said at least some RF signals have a frequency of 1 GHz or greater.

9. The method of claim 7, wherein said DUT test equipment can be operated in two modes, transmission mode and reflection mode, wherein said transmission mode is optimized for test devices comprising high (>100 ohm) resistance ranges, and said reflection mode is optimized for test devices comprising low (<100 ohm) resistance ranges.

10. The method of claim 7, wherein said DUT test equipment and at least one said RF test port comprises at least a first and second RF test port, and wherein said DUT test equipment operates by RF signal transmission mode between at least said first RF test port and said second RF test port.

11. The method of claim 9, further calibrating said DUT test equipment using calibration DUT devices comprising any of a short circuit, open circuit, or a defined fixed resistance between a first RF test port and a second RF test port.

12. The method of claim 11, wherein said defined fixed resistance is between 10 and 5000 ohms.

13. The method of claim 7, wherein said DUT test equipment operates by RF signal reflectance mode over at least one said RF test port and said ground.

14. The method of claim 1, further using thermoreflectance imaging to determine a location on said substrate of at least some defects caused by said elevated temperature.

15. The method of claim 1, wherein said high-frequency RF integrated circuits (DUT) is a digital circuit (digital-DUT) configured to respond to high-frequency square-wave type digital inputs;

further performing accelerated testing of said digital-DUT by using a range of RF frequencies configured to approximate said high-frequency square-wave type digital inputs.

16. The method of claim 15, wherein said range of RF frequencies is selected to be a Fourier transform approximation of said high-frequency square-wave type digital inputs.

\* \* \* \* \*